United States Patent
Kato et al.

(10) Patent No.: US 8,961,691 B2
(45) Date of Patent: Feb. 24, 2015

(54) FILM DEPOSITION APPARATUS, FILM DEPOSITION METHOD, COMPUTER READABLE STORAGE MEDIUM FOR STORING A PROGRAM CAUSING THE APPARATUS TO PERFORM THE METHOD

(75) Inventors: Hitoshi Kato, Oshu (JP); Kazuteru Obara, Oshu (JP); Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1453 days.

(21) Appl. No.: 12/550,468

(22) Filed: Aug. 31, 2009

(65) Prior Publication Data
US 2010/0055351 A1 Mar. 4, 2010

(30) Foreign Application Priority Data

Sep. 4, 2008 (JP) ................... 2008-227023
Sep. 4, 2008 (JP) ................... 2008-227025
Sep. 4, 2008 (JP) ................... 2008-227026

(51) Int. Cl.
*C23C 16/46* (2006.01)
*C23C 16/00* (2006.01)
*C23C 16/44* (2006.01)
*C23C 16/52* (2006.01)
*C23C 16/455* (2006.01)

(52) U.S. Cl.
CPC ..... *C23C 16/45551* (2013.01); *C23C 16/45521* (2013.01); *C23C 16/45563* (2013.01); *C23C 16/46* (2013.01)
USPC ............ 118/725; 118/666; 118/719; 118/730

(58) Field of Classification Search
USPC .......................................... 118/719, 730, 725
See application file for complete search history.

(56) References Cited

U.S. PATENT DOCUMENTS

| 4,987,856 A | * | 1/1991 | Hey et al. ................. 118/723 E |
| 5,338,362 A | * | 8/1994 | Imahashi ...................... 118/719 |
| 5,817,156 A | * | 10/1998 | Tateyama et al. ............ 29/25.01 |
| 6,518,547 B2 | * | 2/2003 | Takahashi et al. ............ 219/390 |
| 2007/0218702 A1 | * | 9/2007 | Shimizu et al. ............... 438/758 |

FOREIGN PATENT DOCUMENTS

| JP | 63-000112 | 1/1988 |
| JP | 2001-254181 | 9/2001 |

* cited by examiner

*Primary Examiner* — Parviz Hassanzadeh
*Assistant Examiner* — Nathan K Ford
(74) *Attorney, Agent, or Firm* — IPUSA, PLLC

(57) ABSTRACT

A disclosed film deposition apparatus includes a susceptor having in one surface a substrate receiving portion provided rotatably in a chamber; a heating unit including plural independently controllable heating portions, thereby heating the susceptor; a first reaction gas supplying portion for supplying a first reaction gas; a second reaction gas supplying portion for supplying a second reaction gas; a separation area between a first process area where the first reaction gas is supplied and a second process area where the second reaction gas is supplied, the separation area including a separation gas supplying portion for supplying a first separation gas in the separation area, and a ceiling surface opposing the one surface to produce a thin space; a center area having an ejection hole for ejecting a second separation gas along the one surface; and an evacuation opening for evacuating the chamber.

6 Claims, 31 Drawing Sheets

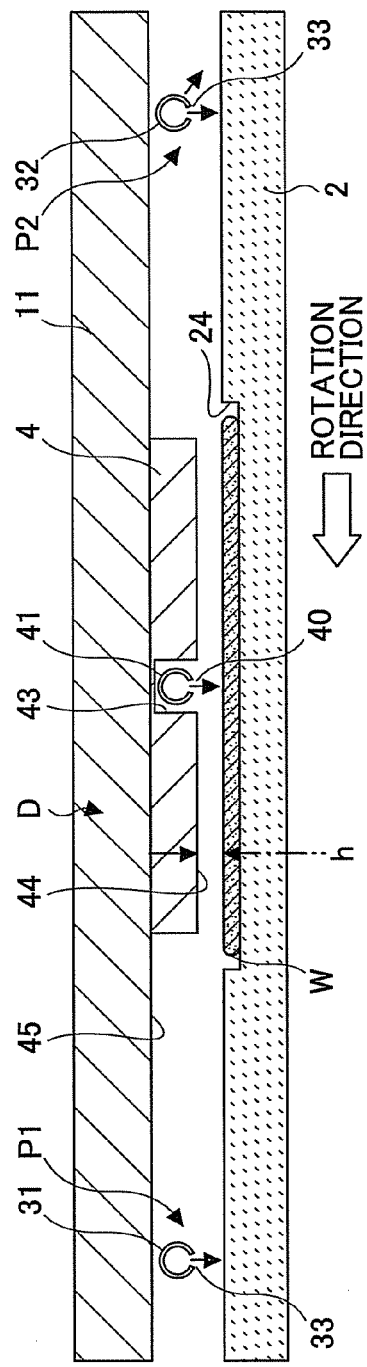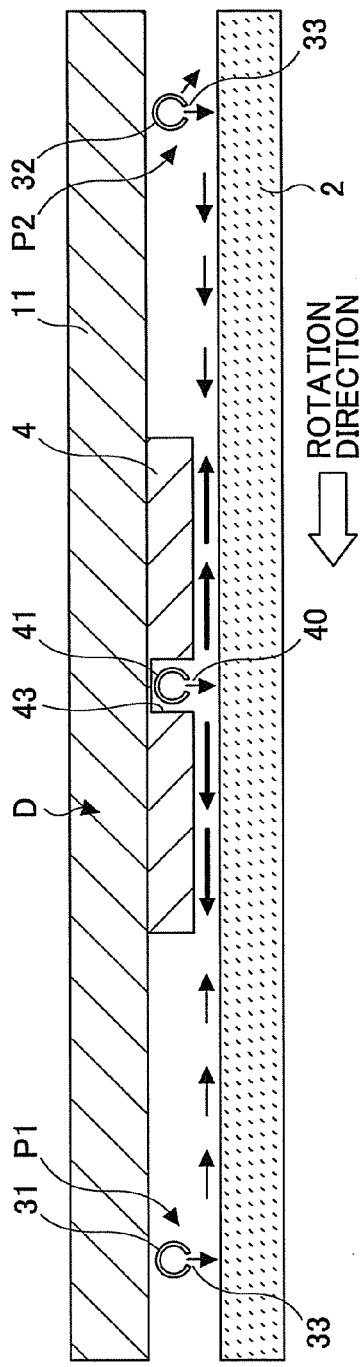

FILM DEPOSITION APPARATUS, FILM DEPOSITION METHOD, COMPUTER READABLE STORAGE MEDIUM FOR STORING A PROGRAM CAUSING THE APPARATUS TO PERFORM THE METHOD

CROSS-REFERENCE TO RELATED APPLICATIONS

The present application is based on Japanese Patent Applications No. 2008-227023, 2008-227025, and 2008-227026 filed with the Japanese Patent Office on Sep. 4, 2008, the entire contents of which are hereby incorporated herein by reference.

BACKGROUND OF THE INVENTION

1. Field of the Invention

The present invention relates to a film deposition apparatus and a film deposition method for depositing a film on a substrate by carrying out plural cycles of supplying in turn at least two source gases to the substrate in order to form plural layers of a reaction product, and a storage medium storing a computer program for carrying out the film deposition method.

2. Description of the Related Art

As a film deposition technique in a semiconductor fabrication process, there has been known a so-called Atomic Layer Deposition (ALD) or Molecular Layer Deposition (MLD), in which a first reaction gas is adsorbed on a surface of a semiconductor wafer (referred to as a wafer hereinafter) under vacuum and then a second reaction gas is adsorbed on the surface of the wafer in order to form one or more atomic or molecular layers through reaction of the first and the second reaction gases on the surface of the wafer, and such an alternating adsorption of the gases is repeated plural times, thereby depositing a film on the wafer. This technique is advantageous in that the film thickness can be controlled at higher accuracy by the number of times of alternately supplying the gases, and in that the deposited film can have excellent uniformity over the wafer. Therefore, this deposition method is thought to be promising as a film deposition technique that can address further miniaturization of semiconductor devices.

In order to carry out such a film deposition method, a film deposition apparatus having a vacuum chamber and a susceptor that holds plural wafers along a rotation direction of the susceptor (Patent document 1). Patent document 1 discloses a process chamber in which plural wafers are placed on a wafer support member (rotation table) at equal angular intervals along a rotation direction of the wafer support member, the wafer support member being horizontally rotated in order to deposit a film on the wafers, first and second gas ejection nozzles are located along the rotation direction and oppose the wafer support member, and purge gas nozzles that are located between the first and the second gas ejection nozzles. According to such a vacuum chamber, the purge gas nozzles create gas curtains for impeding the first and the second reaction gases from being mixed.

Patent Document 1: Japanese Patent Publication No. Japanese Patent Application Laid-Open Publication No. 2001-254181.

SUMMARY OF THE INVENTION

In an MLD (ALD) apparatus using a rotatable susceptor, because four through six wafers having a diameter of 300 mm may be placed on the susceptor, for example, a diameter of the susceptor may reach one meter. Because the susceptor is usually heated by a heater or the like arranged to oppose a back surface of the susceptor, across-wafer temperature uniformity, which is uniform enough to reduce variations of characteristics of semiconductor devices formed in the wafer, is not easily improved when the susceptor has such a large diameter.

The present invention has been made in view of the above, and provides a film deposition apparatus in which the susceptor may be uniformly heated, a film deposition method using the apparatus, and a computer readable medium for storing a program causing the apparatus to carry out the method.

A first aspect of the present invention provides a film deposition apparatus for depositing a film on a substrate by carrying out a cycle of alternately supplying at least two kinds of reaction gases that react with each other to the substrate to produce a layer of a reaction product in a chamber. The film deposition apparatus includes a susceptor rotatably provided in the chamber; a substrate receiving portion in which the substrate is placed that is provided in one surface of the susceptor; a heating unit including plural independently controllable heating portions, thereby heating the susceptor; a first reaction gas supplying portion configured to supply a first reaction gas to the one surface; a second reaction gas supplying portion configured to supply a second reaction gas to the one surface, the second reaction gas supplying portion being separated from the first reaction gas supplying portion along a rotation direction of the susceptor; a separation area located along the rotation direction between a first process area in which the first reaction gas is supplied and a second process area in which the second reaction gas is supplied; a center area that is located substantially in a center portion of the chamber in order to separate the first process area and the second process area, and that has an ejection hole that ejects a first separation gas along the one surface; and an evacuation opening provided in the chamber in order to evacuate the chamber. The separation area includes a separation gas supplying portion that supplies a second separation gas, and a ceiling surface that creates in relation to the one surface of the susceptor a thin space in which the second separation gas may flow from the separation area to the process area side in relation to the rotation direction.

A second aspect of the present invention provides a film deposition method for depositing a film on a substrate by carrying out a cycle of alternately supplying at least two kinds of reaction gases that react with each other to the substrate to produce a layer of a reaction product in a chamber. The film deposition method comprises steps of: placing the substrate on a susceptor rotatably provided in the chamber, the susceptor including a substrate receiving portion in which the substrate is placed that is provided in one surface of the susceptor; rotating the susceptor on which the substrate is placed; heating the susceptor with a heating unit including plural independently controllable heating portions; supplying a first reaction gas from a first reaction gas supplying portion to the susceptor; supplying a second reaction gas from a second reaction gas supplying portion to the susceptor, the second reaction gas supplying portion being separated from the first reaction gas supplying portion along a rotation direction of the susceptor; supplying a first separation gas from a separation gas supplying portion provided in a separation area located between a first process area in which the first reaction gas is supplied from the first reaction gas supplying portion and a second process area in which the second reaction gas is supplied from the second reaction gas supplying portion, in order to flow the first separation gas from the separation area to the process area relative to the rotation direction of the susceptor in a thin space created between a ceiling surface of the separation area and the susceptor; supplying a second separation gas from an ejection hole formed in a center area located in a center portion of the chamber; and evacuating the chamber.

A third aspect of the present invention provides a film deposition apparatus for depositing a film on a substrate by carrying out a cycle of alternately supplying at least two kinds of reaction gases that react with each other to the substrate to produce a layer of a reaction product in a chamber. The film deposition apparatus includes a heating portion configured to radiatively heat the substrate; a susceptor rotatably provided in the chamber; a substrate receiving portion in which the substrate is placed that is provided in one surface of the susceptor; a first reaction gas supplying portion configured to supply a first reaction gas to the one surface; a second reaction gas supplying portion configured to supply a second reaction gas to the one surface, the second reaction gas supplying portion being separated from the first reaction gas supplying portion along a rotation direction of the susceptor; a separation area located along the rotation direction between a first process area in which the first reaction gas is supplied and a second process area in which the second reaction gas is supplied; a center area that is located substantially in a center portion of the chamber in order to separate the first process area and the second process area, and has an ejection hole that ejects a first separation gas along the one surface; and an evacuation opening provided in the chamber in order to evacuate the chamber. The separation area includes a separation gas supplying portion that supplies a second separation gas, and a ceiling surface that creates in relation to the one surface of the susceptor a thin space in which the second separation gas may flow from the separation area to the process area side in relation to the rotation direction.

A fourth aspect of the present invention provides a film deposition method for depositing a film on a substrate by carrying out a cycle of alternately supplying at least two kinds of reaction gases that react with each other to the substrate to produce a layer of a reaction product in a chamber. The film deposition method comprising steps of: placing the substrate on a susceptor rotatably provided in the chamber, the susceptor including a substrate receiving portion in which the substrate is placed that is provided in one surface of the susceptor; rotating the susceptor on which the substrate is placed; radiatively heating the substrate placed in the substrate receiving portion; supplying a first reaction gas from a first reaction gas supplying portion to the susceptor; supplying a second reaction gas from a second reaction gas supplying portion to the susceptor, the second reaction gas supplying portion being separated from the first reaction gas supplying portion along a rotation direction of the susceptor; supplying a first separation gas from a separation gas supplying portion provided in a separation area located between a first process area in which the first reaction gas is supplied from the first reaction gas supplying portion and a second process area in which the second reaction gas is supplied from the second reaction gas supplying portion, in order to flow the first separation gas from the separation area to the process area relative to the rotation direction of the susceptor in a thin space created between a ceiling surface of the separation area and the susceptor; supplying a second separation gas from an ejection hole formed in a center area located in a center portion of the chamber; and evacuating the chamber.

BRIEF DESCRIPTION OF THE DRAWINGS

FIGS. 6A and 6B are projected cross-sectional diagrams showing a separation area and a process area in the film deposition apparatus in FIG. 1;

DETAILED DESCRIPTION OF THE PREFERRED EMBODIMENT

Figure 1:
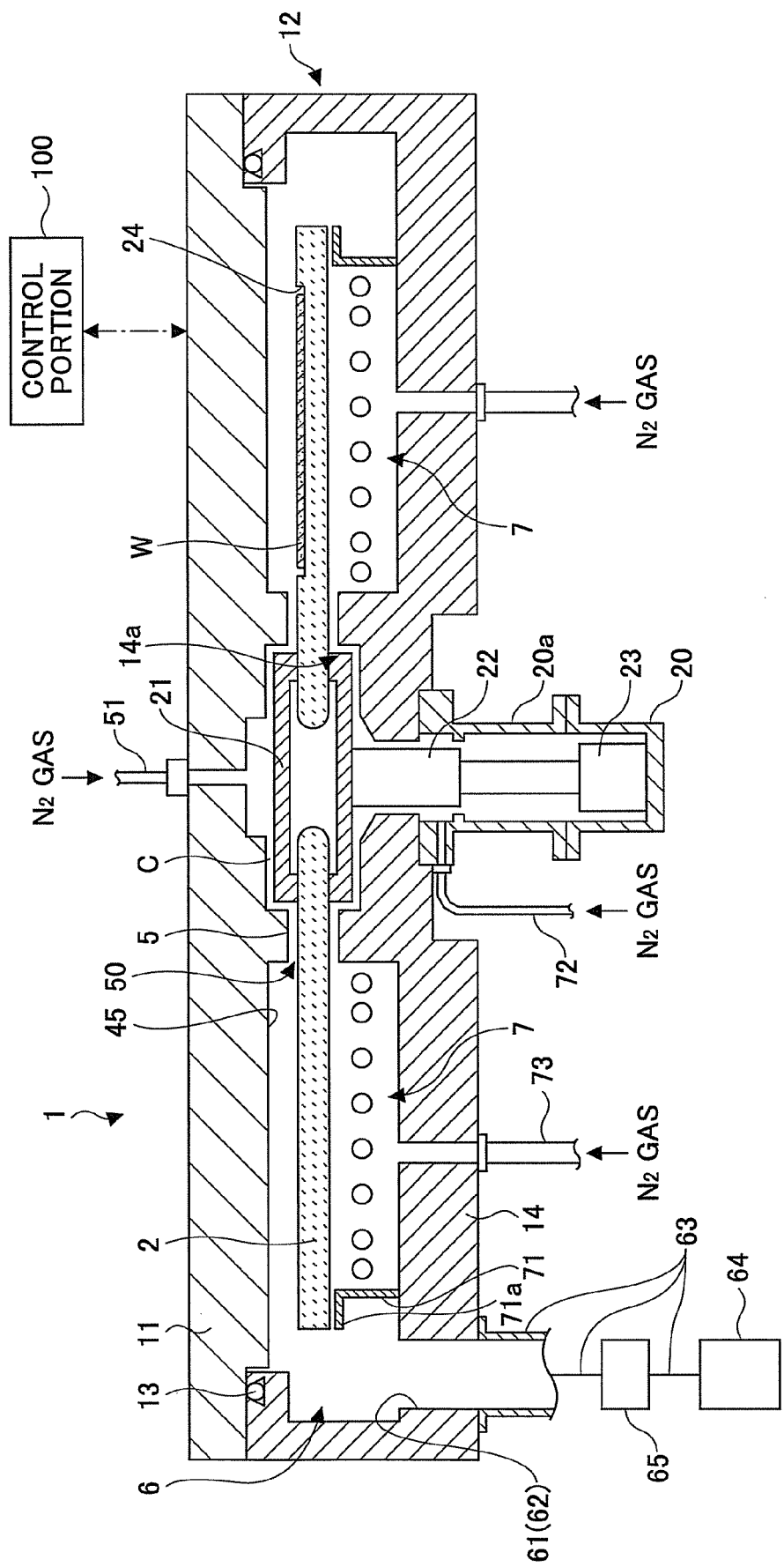
FIG. 1 is a schematic cross-sectional view of a film deposition apparatus according to a first embodiment of the present invention.

According to embodiments of the present invention, a film deposition apparatus in which the susceptor may be uniformly heated, a film deposition method using the apparatus, and a computer readable medium for storing a program causing the apparatus to carry out the method are provided.

Non-limiting, exemplary embodiments of the present invention will now be described with reference to the accompanying drawings. In the drawings, the same or corresponding reference numerals are given to the same or corresponding members or components. It is noted that the drawings are illustrative of the invention, and there is no intention to indicate scale or relative proportions among the members or components. Therefore, the specific size should be determined by a person having ordinary skill in the art in view of the following non-limiting embodiments.

First Embodiment

FIG. 1 is a cross-sectional view of a film deposition apparatus according to a first embodiment of the present invention. As shown, the film deposition apparatus has a vacuum chamber 1 having a flattened cylinder shape, and a susceptor 2 that is located inside the vacuum chamber 1 and has a rotation center at a center of the vacuum chamber 1. The vacuum chamber 1 includes a chamber body 12 and a ceiling plate 11 that can be separated from the chamber body 12. The ceiling plate 11 is arranged on the chamber body 12 via a ceiling member such as an O ring 13 so that the vacuum chamber 1 is hermetically sealed. On the other hand, the ceiling plate 11 can be raised by a driving mechanism (not shown) when the ceiling plate 11 has to be removed from the chamber body 12.

In addition, a bottom portion 14 of the chamber body 12 has a raised portion 14a at the center, and a cover member 71 having a flattened cylinder shape. A space defined by the raised portion 14a, the cover member 71, and the susceptor 2 arranged above the raised portion 14a and the cover member 71 is used as a heater housing, and a heater unit 7 is housed in the heater housing. The heater unit 7 is composed of a ring-shaped heater element having, for example, a quartz tube and a heating wire enclosed in the tube. The heating wire may be made of metal such as molybdenum, tungsten, tantalum, Fe—Cr—Al alloy, Ni—Cr alloy, and the like. The heating wire may be enclosed under vacuum or with an inert gas such as helium (He), argon (Ar) and the like or nitrogen ($N_2$) gas in the tube. In addition, the heating wire may be inserted through the quartz tube, and the inside of the tube is purged with inert gas or $N_2$ gas.

Figure 2:
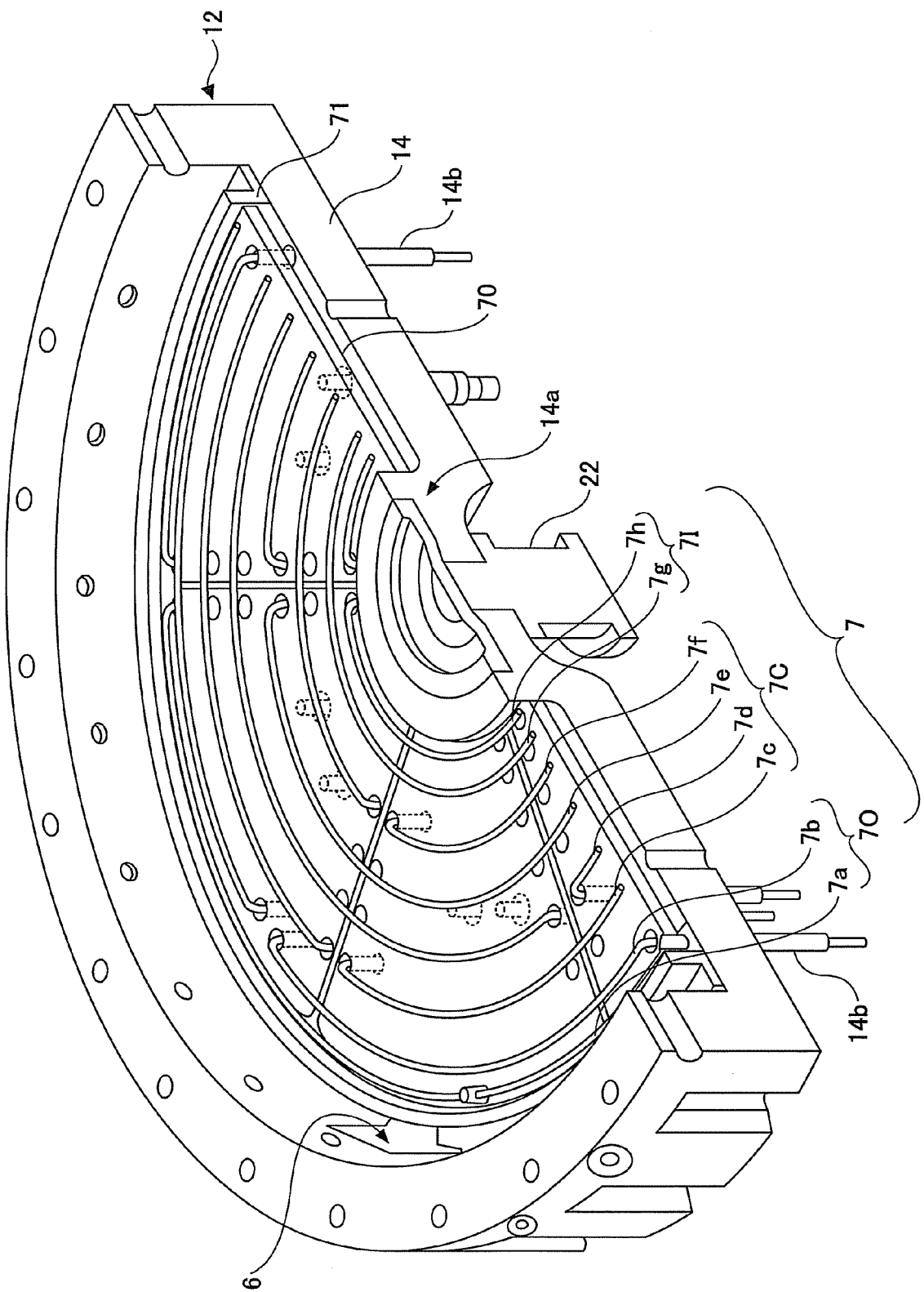
FIG. 2 is a partial perspective view showing a heater unit of the film deposition apparatus in FIG. 1.
Figure 3:
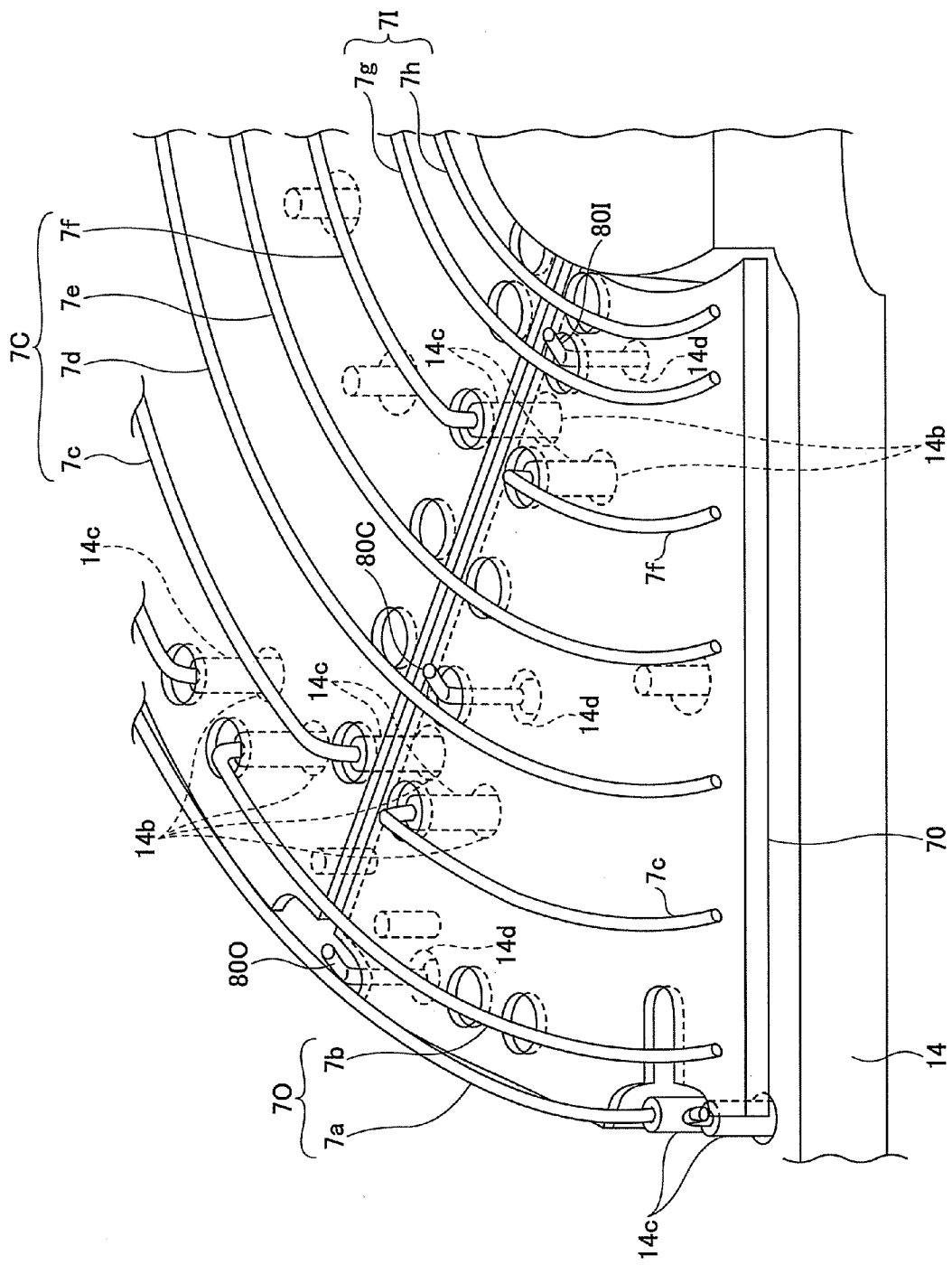
FIG. 3 is an enlarged partial perspective view showing the heater unit in FIG. 2.

Referring to FIGS. 2 and 3, the heater unit 7 is further explained. FIG. 2 is a partial perspective view showing the inner configuration of the vacuum chamber 1, in which the ceiling plate 11, a gas supplying nozzle (described later) and the susceptor 2 are not illustrated for simplicity purposes. As shown, the heater unit 7 is preferably composed of 8 ring-shaped heater elements that are concentrically arranged with one another. An outermost heater element 7a and a second outermost heater element 7b make an outer heater 7O; third through sixth outermost heater elements 7c, 7d, 7e, 7f make a center heater 7C; and an innermost heater element 7h and a second innermost heater element 7g make an inner heater 7I.

In such a manner, the heater unit 7 is divided into three portions along its radial direction.

Referring to FIG. 3, which is a partially enlarged representation of FIG. 2, the heater elements 7a through 7h are electrically connected to electrical feedthroughs 14c arranged through through-holes 14b formed in the bottom portion 14 of the chamber body 12, and may be supported by the electrical feedthroughs 14c. Outside of the vacuum chamber 1, the heater elements 7a, 7b constituting the outer heater 7O are connected in series or parallel with each other via the electrical feedthroughs 14c, and connected to a power supply (not shown). The center heater 7C and the inner heater 7I have the same electrical configuration.

As shown in FIG. 3 only, a thermocouple 8O is hermetically inserted into the inside of the vacuum chamber 1 through a through-hole 14d formed in the bottom portion 14 of the chamber body 12 between the heater elements 7a, 7b. An upper end of the thermocouple 8O may be away from the back surface of the susceptor 2 arranged above the heater unit 7 by about 1 mm to about 10 mm, preferably about 2 mm to about 5 mm, or more preferably about 3 mm. With such an arrangement, the thermocouple 8O can measure a temperature of a portion of the susceptor 2, the portion being heated by the outer heater 7O. In addition, the thermocouple 8O is connected to a temperature controller (not shown), which generates a temperature control signal based on a thermal electromotive force caused by the heat of the susceptor 2 in the thermocouple 8O and outputs the signal to the power source connected to the outer heater 7O (heater elements 7a, 7b). With this, the portion heated by the outer heater 7O is temperature-controlled.

Moreover, a thermocouple 8C is arranged between the heater elements 7d, 7e in the same manner and connected to a temperature controller (not shown). With this, a temperature of a portion of the susceptor, the portion being heated by the center heater 7C, is measured and controlled in accordance with the measured temperature. Furthermore, a thermocouple 8I is arranged between the heater elements 7g, 7h and connected to a temperature controller (not shown). With this, a temperature of a portion of the susceptor, the portion being heated by the center heater 7I, is measured and controlled in accordance with the measured temperature. The power sources corresponding to the outer heater 7O, the center heater 7C, and the inner heater 7I may be replaced with a common power source that can supply electrical power independently to the outer heater 7O, the center heater 7C, and the inner heater 7I.

As only shown in FIGS. 2 and 3 (not shown in other drawings), a protection plate 70 is arranged between the bottom portion 14 of the chamber body 12 and the heater unit 7 and supported by a predetermined support member. The protection plate 70 has a shape of a disk which can be housed in the heater housing, and is made of, for example, a stainless steel. The protection plate 70 has through-holes in positions corresponding to the feedthoughs 14c connected to the heater elements 7a through 8h in order to allow the feedthroughs 14c to pass through. The protection plate 70 is provided in order to protect the heater elements 7a through 7h and impede the bottom portion 14 of the chamber body 12 from being heated by the heater elements 7a through 8h. The protection plate 70 may serve as a reflector and may have a conduit for fluid to flow through inside the protection plate 70. Cooling water may flow through the conduit.

The susceptor 2 is made of a carbon plate having a thickness of about 20 mm in this embodiment. An upper surface and the back surface of the susceptor 2 may be coated with SiC. Referring to FIG. 2, the susceptor 2 has a circular opening at the center, and is held around the circular opening by a cylindrically shaped core portion 21. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 is hermetically fixed to a bottom surface of the bottom portion 14 via a flanged pipe portion 20a, which isolates an inner environment of the case body 20 from an outer environment.

Figure 4:
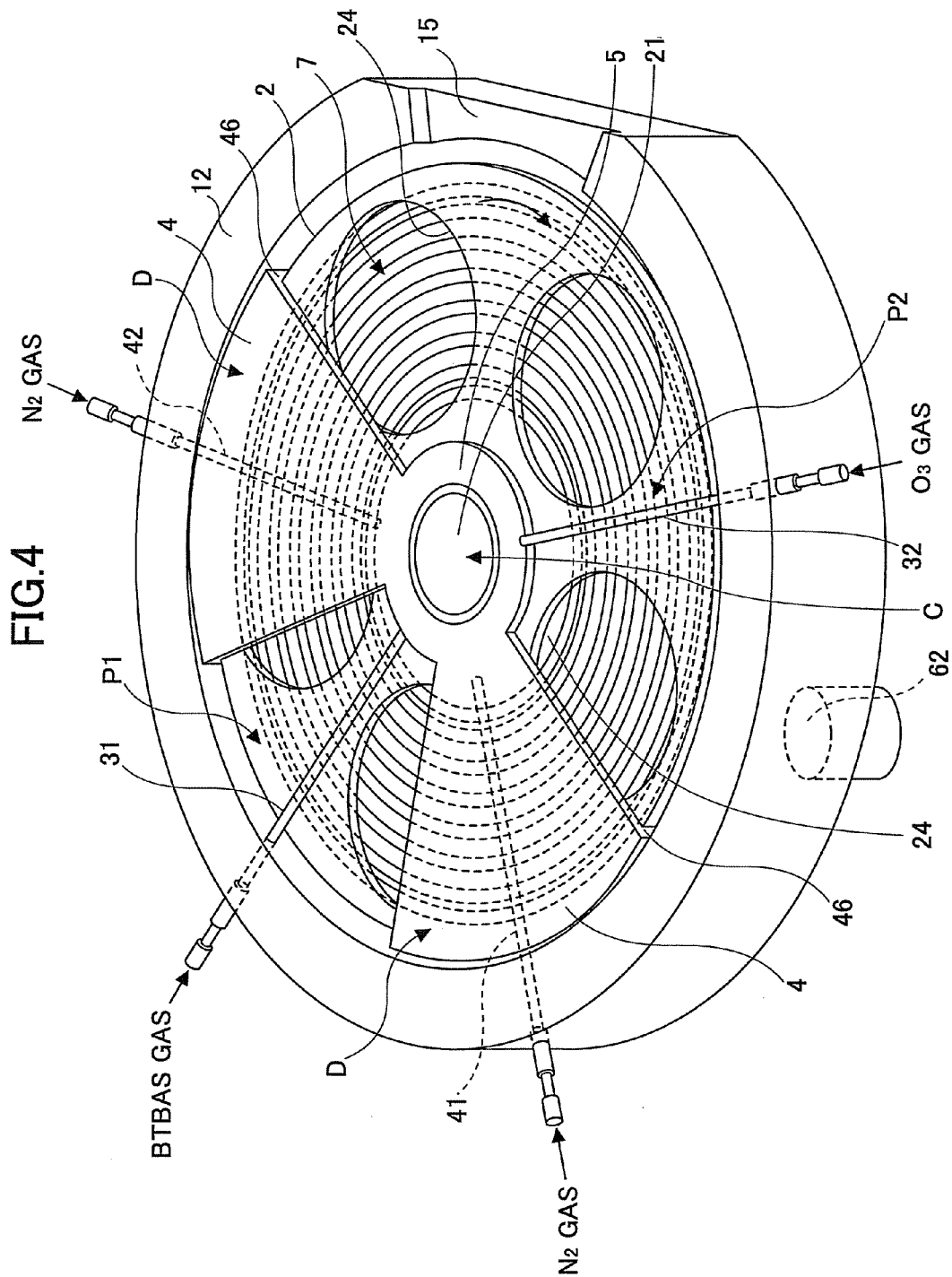
FIG. 4 is a perspective view showing the film deposition apparatus in FIG. 1.
Figure 5:
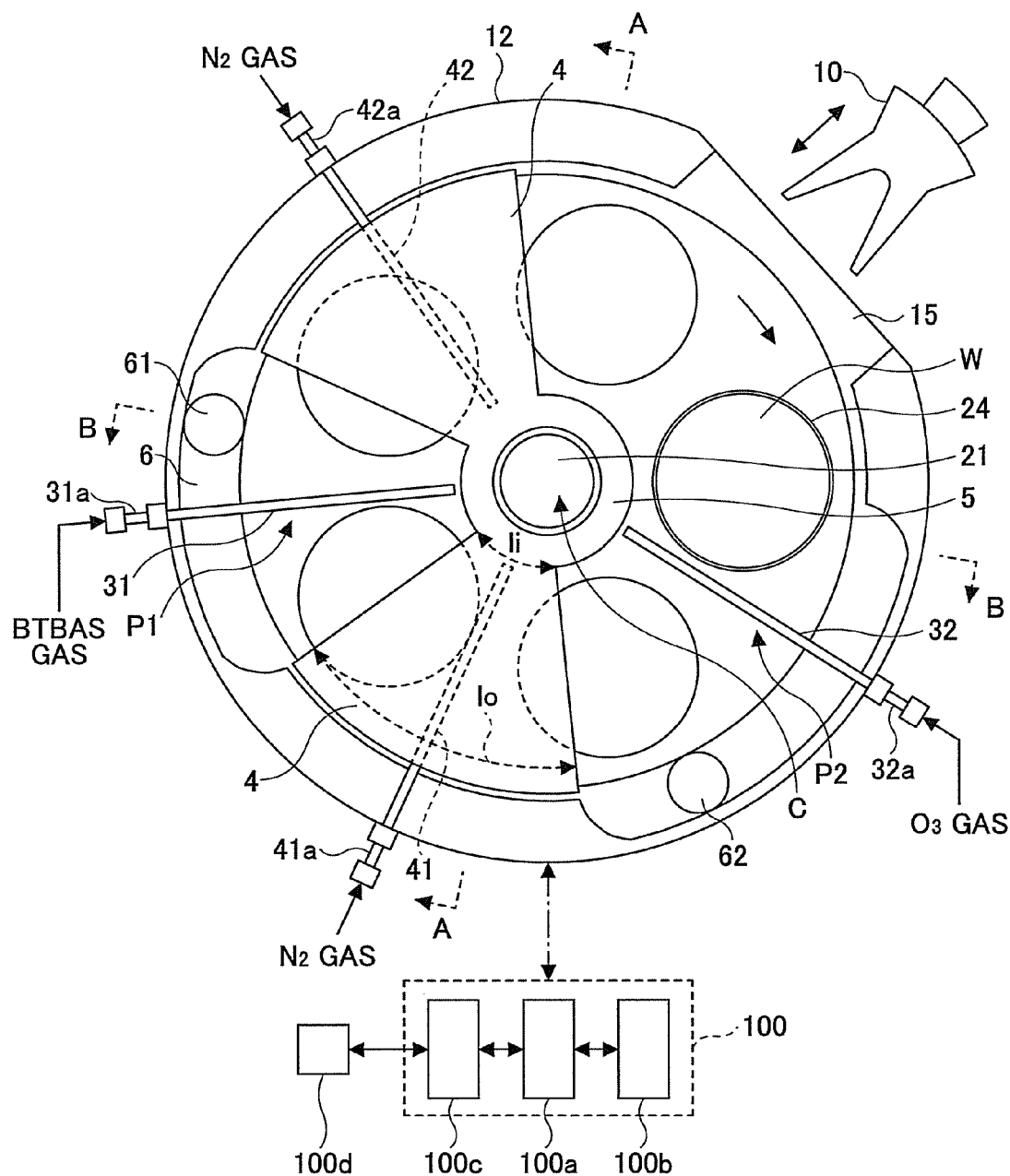
FIG. 5 is a plan view showing the film deposition apparatus in FIG. 1.

As shown in FIGS. 4 and 5, plural (five in the illustrated example) circular concave portions 24, each of which receives a wafer W, are formed in a top surface of the susceptor 2, although only one wafer W is illustrated in FIG. 5. The concave portions 24 are located at equal angular intervals in the susceptor 2.

FIG. 6A is a projected cross-sectional diagram taken along an arc extending from a first reaction gas nozzle 31 to a second reaction gas nozzle 32 shown in FIG. 5. As shown in FIG. 6A, the concave portion 24 has a diameter slightly larger, for example, by about 4 mm than the diameter of the wafer W and a depth equal to a thickness of the wafer W. Therefore, when the wafer W is placed in the concave portion 24, a surface of the wafer W is at the same elevation of a surface of an area of the susceptor 2, the area excluding the concave portions 24. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference has to be as close to zero as possible to the extent allowed by machining accuracy.

In the bottom of the concave portion 24 there are formed three through holes (not shown) through which three corresponding elevation pins (see FIG. 10) are raised/lowered. The elevation pins support a back surface of the wafer W and raises/lowers the wafer W.

The concave portions 24 are wafer W receiving areas provided to position the wafers W and prevent the wafers W from being thrown out by centrifugal force caused by rotation of the susceptor 2. However, the wafer W receiving areas are not limited to the concave portions 24, but may be performed by guide members that are located at predetermined angular intervals on the susceptor 2 to hold the edges of the wafers W. For example, the wafer W receiving areas may be performed by electrostatic chucks.

Referring again to FIGS. 4 and 5, the vacuum chamber 1 includes a first reaction gas nozzle 31, a second reaction gas nozzle 32, and separation gas nozzles 41, 42 above the susceptor 2, all of which extend in radial directions and at predetermined angular intervals. With this configuration, the concave portions 24 can move through and below the nozzles 31, 32, 41, and 42. In the illustrated example, the second reaction gas nozzle 32, the separation gas nozzle 41, the first reaction gas nozzle 31, and the separation gas nozzle 42 are arranged clockwise in this order. These gas nozzles 31, 32, 41, and 42 penetrate the circumferential wall portion of the chamber body 12 and are supported by attaching their base ends, which are gas inlet ports 31a, 32a, 41a, 42a, respectively, on the outer circumference of the wall portion. Although the gas nozzles 31, 32, 41, 42 are introduced into the vacuum chamber 1 from the circumferential wall portion of the vacuum chamber 1 in the illustrated example, these nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the vacuum chamber 1 and the gas inlet port 31a (32a, 41a, 42a) can be connected to the other opening of the L-shaped conduit outside the vacuum chamber 1.

Although not shown, the reaction gas nozzle 31 is connected to a gas supplying source of bis (tertiary-butylamino) silane (BTBAS), which is a first source gas, and the reaction gas nozzle 32 is connected to a gas supplying source of $O_3$ (ozone) gas, which is a second source gas.

The reaction gas nozzles 31, 32 have plural ejection holes 33 to eject the corresponding source gases downward. The plural ejection holes 33 are arranged in longitudinal directions of the reaction gas nozzles 31, 32 at predetermined intervals. The ejection holes 33 have an inner diameter of about 0.5 mm, and are arranged at intervals of about 10 mm in this embodiment. The reaction gas nozzles 31, 32 are a first reaction gas supplying portion and a second reaction gas supplying portion, respectively, in this embodiment. In addition, an area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

On the other hand, the separation gas nozzles 41, 42 are connected to gas supplying sources of $N_2$ (nitrogen) gas (not shown). The separation gas nozzles 41, 42 have plural ejection holes 40 to eject the separation gases downward from the plural ejection holes 40. The plural ejection holes 40 are arranged at predetermined intervals in longitudinal directions of the separation gas nozzles 41, 42. The ejection holes 40 have an inner diameter of about 0.5 mm, and are arranged at intervals of about 10 mm in this embodiment.

The separation gas nozzles 41, 42 are provided in separation areas D that are configured to separate the first process area P1 and the second process area P2. In each of the separation areas P, there is provided a convex portion 4 on the ceiling plate 11, as shown in FIGS. 4 through 6. The convex portion 4 has a top view shape of a sector whose apex lies at the center of the vacuum chamber 1 and whose arced periphery lies near and along the inner circumferential wall of the chamber body 12. In addition, the convex portion 4 has a groove portion 43 that extends in the radial direction as if the groove portion 43 substantially bisected the convex portion 4. The separation gas nozzle 41 (42) is located in the groove portion 43. A circumferential distance between the center axis of the separation gas nozzle 41 (42) and one side of the sector-shaped convex portion 4 is substantially equal to the other circumferential distance between the center axis of the separation gas nozzle 41 (42) and the other side of the sector-shaped convex portion 4. Incidentally, while the groove portion 43 is formed in order to bisect the convex portion 4 in this embodiment, the groove portion 42 is formed so that an upstream side of the convex portion 4 relative to the rotation direction of the susceptor 2 is wider, in other embodiments.

With the above configuration, there are flat low ceiling surfaces 44 (first ceiling surfaces) on both sides of the separation gas nozzle 41 (42), and high ceiling surfaces 45 (second ceiling surfaces) outside of the corresponding low ceiling surfaces 44, as shown in FIG. 6A. The convex portion 4 (ceiling surface 44) provides a separation space, which is a thin space, between the convex portion 4 and the susceptor 2 in order to impede the first and the second gases from entering the thin space and from being mixed.

Referring to FIG. 6B, the $O_3$ gas is impeded from entering the space between the convex portion 4 and the susceptor 2, the $O_3$ gas flowing toward the convex portion 4 from the reaction gas nozzle 32 along the rotation direction of the susceptor 2, and the BTBAS gas is impeded from entering the space between the convex portion 4 and the susceptor 2, the BTBAS gas flowing toward the convex portion 4 from the reaction gas nozzle 31 along the counter-rotation direction of the susceptor 2. "The gases being impeded from entering" means that the $N_2$ gas as the separation gas ejected from the separation gas nozzle 41 spreads between the first ceiling surfaces 44 and the upper surface of the susceptor 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gases are completely prevented from entering the separation space, but that the gases cannot proceed farther toward the separation gas nozzle 41 and thus be mixed with each other even when a fraction of the reaction gases enters the separation space. Namely, as long as such effect is demonstrated, the separation area D is to separate the first process area P1 and the second process area P2. Incidentally, the BTBAS gas or the $O_3$ gas adsorbed on the wafer W can pass through below the convex portion 4. Therefore, the gases in "the gases being impeded from entering" mean the gases in a gaseous phase.

Referring to FIGS. 1, 4, and 5, a ring-shaped protrusion portion 5 is provided on a back surface of the ceiling plate 11 so that the inner circumference of the protrusion portion 5 faces the outer circumference of the core portion 21. The protrusion portion 5 opposes the susceptor 2 at an outer area of the core portion 21. In addition, a back surface of the protrusion portion 5 and a back surface of the convex portion 4 form one plane surface. In other words, a height of the back surface of the protrusion portion 5 from the susceptor 2 is the same as a height of the back surface of the convex portion 4, which will be referred to as a height h below. Incidentally, the convex portion 4 is formed not integrally with but separately from the protrusion portion 5 in other embodiments. FIGS. 4 and 5 show the inner configuration of the vacuum chamber 1 whose top plate 11 is removed while the convex portions 4 remain inside the vacuum chamber 1.

The separation area D is configured by forming the groove portion 43 in a sector-shaped plate to be the convex portion 4, and locating the separation gas nozzle 41 (42) in the groove portion 43 in the above embodiment. However, two sector-shaped plates may be attached on the lower surface of the ceiling plate 11 by screws so that the two sector-shaped plates are located on both sides of the separation gas nozzle 41 (32).

When the wafer W having a diameter of about 300 mm is supposed to be processed in the vacuum chamber 1, the convex portion 4 has a circumferential length of, for example, about 146 mm along an inner arc 1*i* (FIG. 5) that is at a distance 140 mm from the rotation center of the susceptor 2, and a circumferential length of, for example, about 502 mm along an outer arc 1*o* (FIG. 5) corresponding to the outermost portion of the concave portions 24 of the susceptor 2 in this embodiment. In addition, a circumferential length from one side wall of the convex portion 4 through the nearest side wall of the groove portion 43 along the outer arc 1*o* is about 246 mm.

In addition, the height h (FIG. 6A) of the back surface of the convex portion 4, or the ceiling surface 44, measured from the top surface of the susceptor 2 (or the wafer W) is, for example, about 0.5 mm through about 10 mm, and preferably about 4 mm. In this case, the rotational speed of the susceptor 2 is, for example, 1 through 500 rotations per minute (rpm). In order to ascertain the separation function performed by the separation area D, the size of the convex portion 4 and the height h of the ceiling surface 44 from the susceptor 2 may be determined depending on the pressure in the vacuum chamber 1 and the rotational speed of the susceptor 2 through experimentation. Incidentally, the separation gas is $N_2$ in this embodiment but may be an inert gas such as He and Ar, or $H_2$ in other embodiments, as long as the separation gas does not affect the deposition of silicon dioxide.

Figure 7:
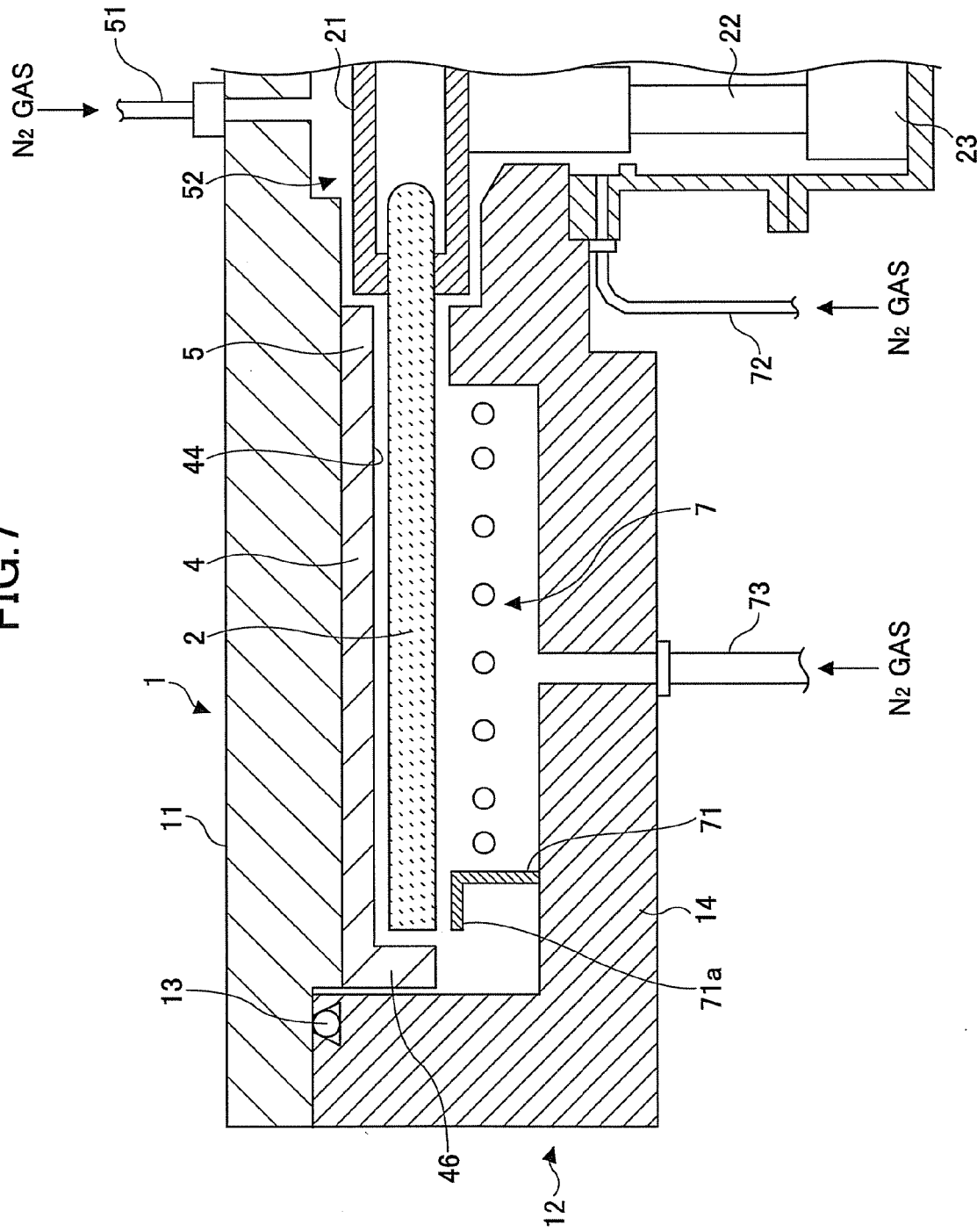
FIG. 7 is a partial cross-sectional view showing the film deposition apparatus in FIG. 1.

FIG. 7 shows a half portion of a cross-sectional view of the vacuum chamber 1, taken along an A-A line in FIG. 5, where the convex portion 4 is shown along with the protrusion portion 5 formed integrally with the convex portion 4. Referring to FIG. 7, the convex portion 4 has a bent portion 46 that bends in an L-shape at the outer circumferential edge of the convex portion 4. Although there are slight gaps between the bent portion 46 and the susceptor 2 and between the bent portion 46 and the chamber body 12, because the convex portion 4 is attached on the back surface of the ceiling portion 11 and removed from the chamber body 12 along with the ceiling portion 11, the bent portion 46 substantially fills out a space between the susceptor 2 and the chamber body 12, thereby preventing the first reaction gas (BTBAS) ejected from the first reaction gas nozzle 31 and the second reaction gas (ozone) ejected from the second reaction gas nozzle 32 from being mixed through the space between the susceptor 2 and the chamber body 12. The gaps between the bent portion 46 and the susceptor 2 and between the bent portion 46 and the chamber body 12 may be the same as the height h of the ceiling surface 44 from the susceptor 2. In the illustrated example, a side wall facing the outer circumferential surface of the susceptor 2 serves as an inner circumferential wall of the separation area D.

Now, referring again to FIG. 1, which corresponds to a cross-sectional view taken along a B-B line in FIG. 5, the chamber body 12 has an indented portion at the inner circumferential portion opposed to the outer circumferential surface of the susceptor 2. The dented portion is referred to as an evacuation area 6 hereinafter. Below the evacuation area 6, there is an evacuation port 61 (see FIG. 5 for another evacuation port 62) which is connected to an evacuation apparatus 64 including a vacuum pump and the like via an evacuation pipe 63, which can also be used for the evacuation port 62. In addition, the evacuation pipe 63 is provided with a pressure controller 65. Plural pressure controllers 65 may be provided to the corresponding evacuation ports 61, 62.

Referring again to FIG. 5, the evacuation port 61 is located between the first reaction gas nozzle 31 and the convex portion 4 that is located downstream relative to the clockwise rotation direction of the susceptor 2 in relation to the first reaction gas nozzle 31, when viewed from above. With this configuration, the evacuation port 61 can substantially exclusively evacuate the BTBAS gas ejected from the reaction gas nozzle 31. On the other hand, the evacuation port 62 is located between the first reaction gas nozzle 32 and the convex portion 4 that is located downstream relative to the clockwise rotation direction of the susceptor 2 in relation to the first reaction gas nozzle 32, when viewed from above. With this configuration, the evacuation port 62 can substantially exclusively evacuate the $O_3$ gas ejected from the reaction gas nozzle 32. Therefore, the evacuation ports 61, 62 so configured may assist the separation areas D to prevent the BTBAS gas and the $O_3$ gas from being mixed.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream relative to the clockwise rotation of the susceptor 2 in relation to the second reaction gas nozzle 32. In addition, a further additional evacuation port may be made at a predetermined position in the chamber body 12. While the evacuation ports 61, 62 are located below the susceptor 2 to evacuate the vacuum chamber 1 through an area between the inner circumferential wall of the chamber body 12 and the outer circumferential surface of the susceptor 2 in the illustrated example, the evacuation ports may be located in the side wall of the chamber body 12. In addition, when the evacuation ports 61, 62 are provided in the side wall of the chamber body 12, the evacuation ports 61, 62 may be located higher than the susceptor 2. In this case, the gases flow along the upper surface of the susceptor 2 into the evacuation ports 61, 62 located higher the susceptor 2. Therefore, it is advantageous in that particles in the vacuum chamber 1 are not blown upward by the gases, compared to when the evacuation ports are provided, for example, in the ceiling plate 11.

Figure 8:
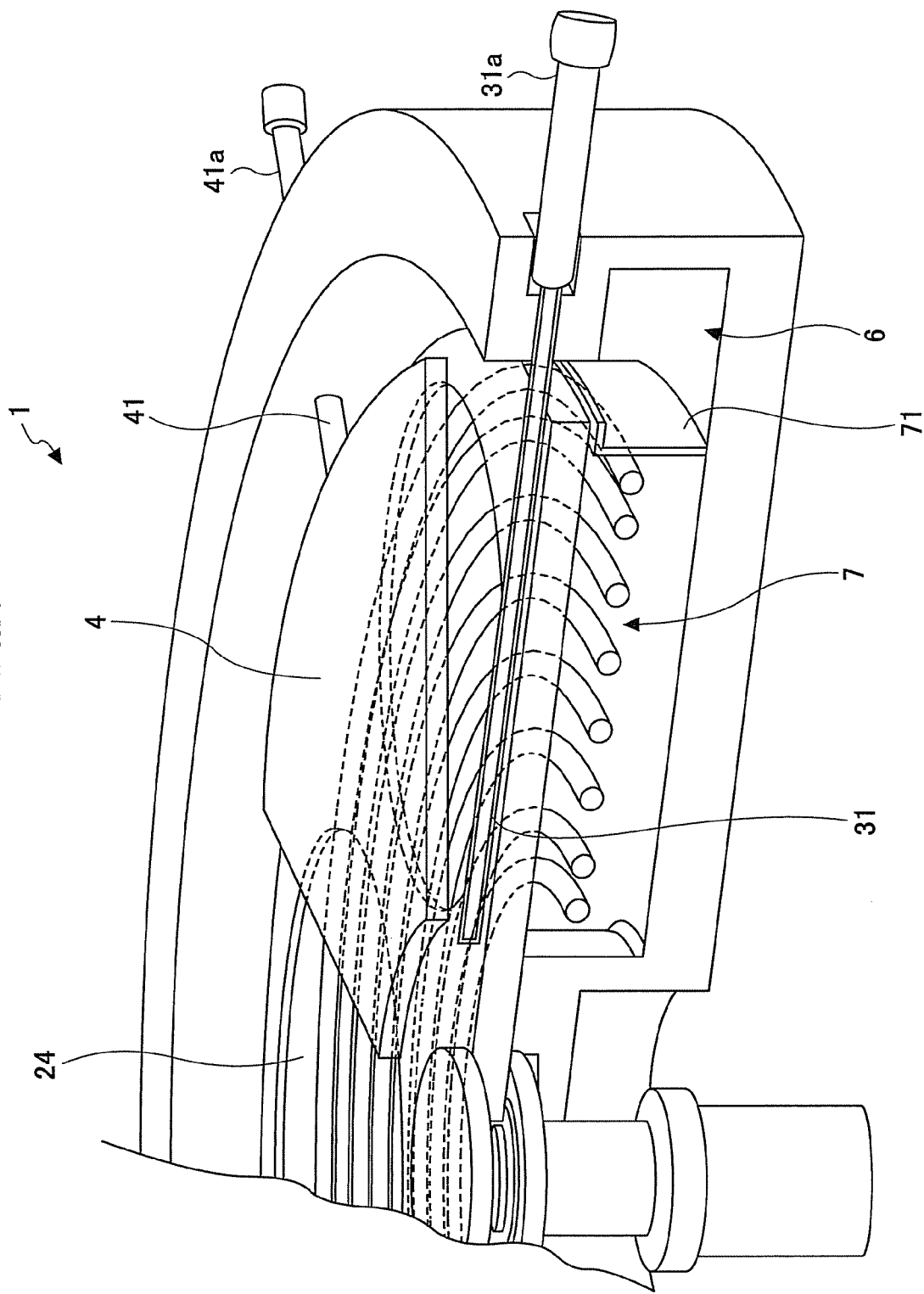
FIG. 8 is a perspective view showing the film deposition apparatus in FIG. 1.

As shown in FIGS. 1, 4, and 8, a ring-shaped heater unit 7 as a heating portion is provided in a space between the bottom portion 14 of the chamber body 12 and the susceptor 2, so that the wafers W placed on the susceptor 2 are heated through the susceptor 2 at a temperature determined by a process recipe. In addition, a cover member 71 is provided beneath the susceptor 2 and near the outer circumference of the susceptor 2 in order to surround the heater unit 7, so that the space where the heater unit 7 is located is partitioned from the outside area of the cover member 71. The cover member 71 has a flange portion 71a at the top. The flange portion 71a is arranged so that a slight gap is maintained between the back surface of the susceptor 2 and the flange portion in order to prevent gas from flowing inside the cover member 71.

Referring back to FIG. 1, the bottom portion 14 has a raised portion in an inside area of the ring-shaped heater unit 7. The top surface of the raised portion comes close to the back surface of the susceptor 2 and the core portion 21, leaving slight gaps between the raised portion and the susceptor 2 and between the raised portion and the core portion 21. In addition, the bottom portion 14 has a center hole through which the rotational shaft 22 passes. The inner diameter of the center hole is slightly larger than the diameter of the rotational shaft 22, leaving a gap for communication with the case body 20 through the flanged pipe portion 20a. A purge gas supplying pipe 72 is connected to an upper portion of the flanged pipe portion 20a. In addition, plural purge gas supplying pipes 73 are connected at predetermined angular intervals to areas below the heater unit 7 in order to purge the space where the heater unit 7 is housed.

With these configurations, $N_2$ purge gas may flow from the purge gas supplying pipe 72 to the heater unit space through the gap between the rotational shaft 22 and the center hole of the bottom portion 14, the gap between the core portion 21 and the raised portion 14a of the bottom portion 14, and the gap between the raised portion of the bottom portion 14 and the back surface of the susceptor 2. In addition, $N_2$ purge gas may flow from the purge gas supplying pipes 73 to the space below the heater unit 7. Then, these $N_2$ purge gases flow into the evacuation port 61 through the gap between the flange portion 71a of the cover member 71 and the back surface of the susceptor 2. These flows of the $N_2$ purge gas are schematically illustrated by arrows in FIG. 9. These $N_2$ purge gases serve as separation gases that prevent the first (second) reaction gas from flowing around the space below the susceptor 2 to be mixed with the second (first) reaction gas.

Figure 9:
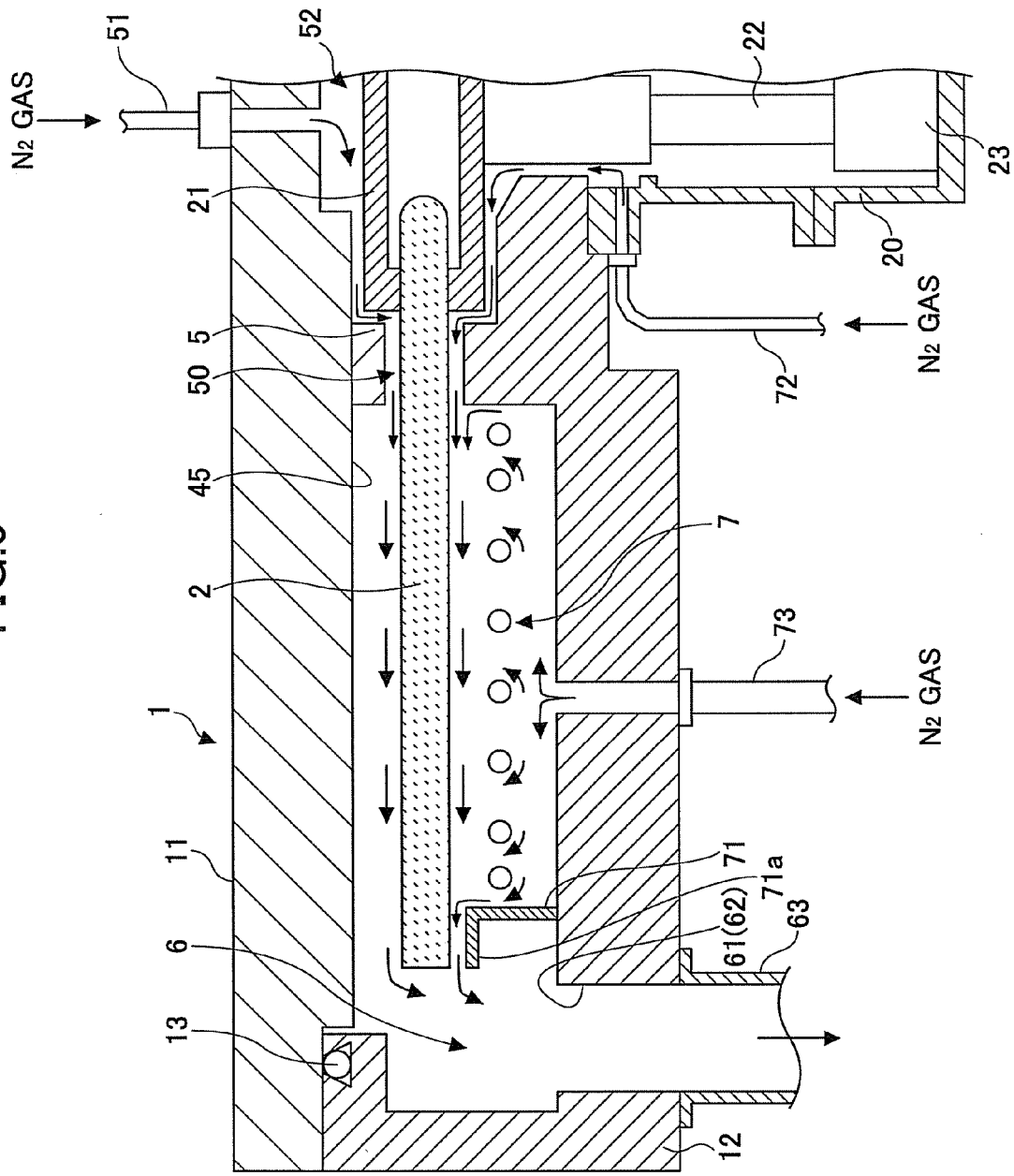
FIG. 9 is a partial cross-sectional view showing the film deposition apparatus in FIG. 1.

Referring to FIG. 9, a separation gas supplying pipe 51 is connected to the top center portion of the ceiling plate 11 of the vacuum chamber 1, so that $N_2$ gas is supplied as a separation gas to a space 52 between the ceiling plate 11 and the core portion 21. The separation gas supplied to the space 52 flows through the thin gap 50 between the protrusion portion 5 and the susceptor 2 and then along the top surface of the susceptor 2, and reaches the evacuation area 6. Because the space 52 and the gap 50 are filled with the $N_2$ gas, the reaction gases (BTBAS, $O_3$) cannot be mixed through the center portion of the susceptor 2. In other words, the film deposition apparatus according to this embodiment is provided with a center area C that is defined by the center portion of the susceptor 2 and the vacuum chamber 1 in order to isolate the first process area P1 and the second process area P2 and is configured to have an ejection opening that ejects the separation gas toward the top surface of the susceptor 2. The ejection opening corresponds to the gap 50 between the protrusion portion 5 and the susceptor 2, in the illustrated example.

Referring again to FIG. 1, a purge gas supplying pipe 72 is connected to the flanged pipe portion 20a and a purge gas ($N_2$ gas) is supplied into the flanged pipe portion 20a and the case body 20. This purge gas flows through a gap between the raised portion 14a of the bottom portion 14 and the rotational shaft 22, a gap between the core portion 21 and the raised portion 14a, and a gap between the raised portion 14a and the susceptor 2 into the heater housing space where the ring-shaped heater unit 7 is arranged. In addition, plural purge gas supplying pipes 73 are connected at predetermined angular intervals to the bottom portion 14 of the chamber body 12 and a purge gas ($N_2$ gas) is supplied to the heater housing space through the purge gas supplying pipes 73. This purge gas flows, along with the purge gas from the purge gas supplying pipe 72 connected to the flanged pipe portion 20a, into the evacuation area 6 through a gap between the cover member 71 and the susceptor 2, and is evacuated through the evacuation ports 61 (62) by the evacuation apparatus 64. The cover member 71 has a flange portion 71a that extends outward along the back surface of the susceptor 2, so that gas is prevented from flowing into the heater housing space from the evacuation area 6. With such a configuration, the first reaction gas and the second reaction gas are impeded from being mixed through the heater housing space and/or a space around the core portion 21 and the rotational shaft 22.

Figure 10:
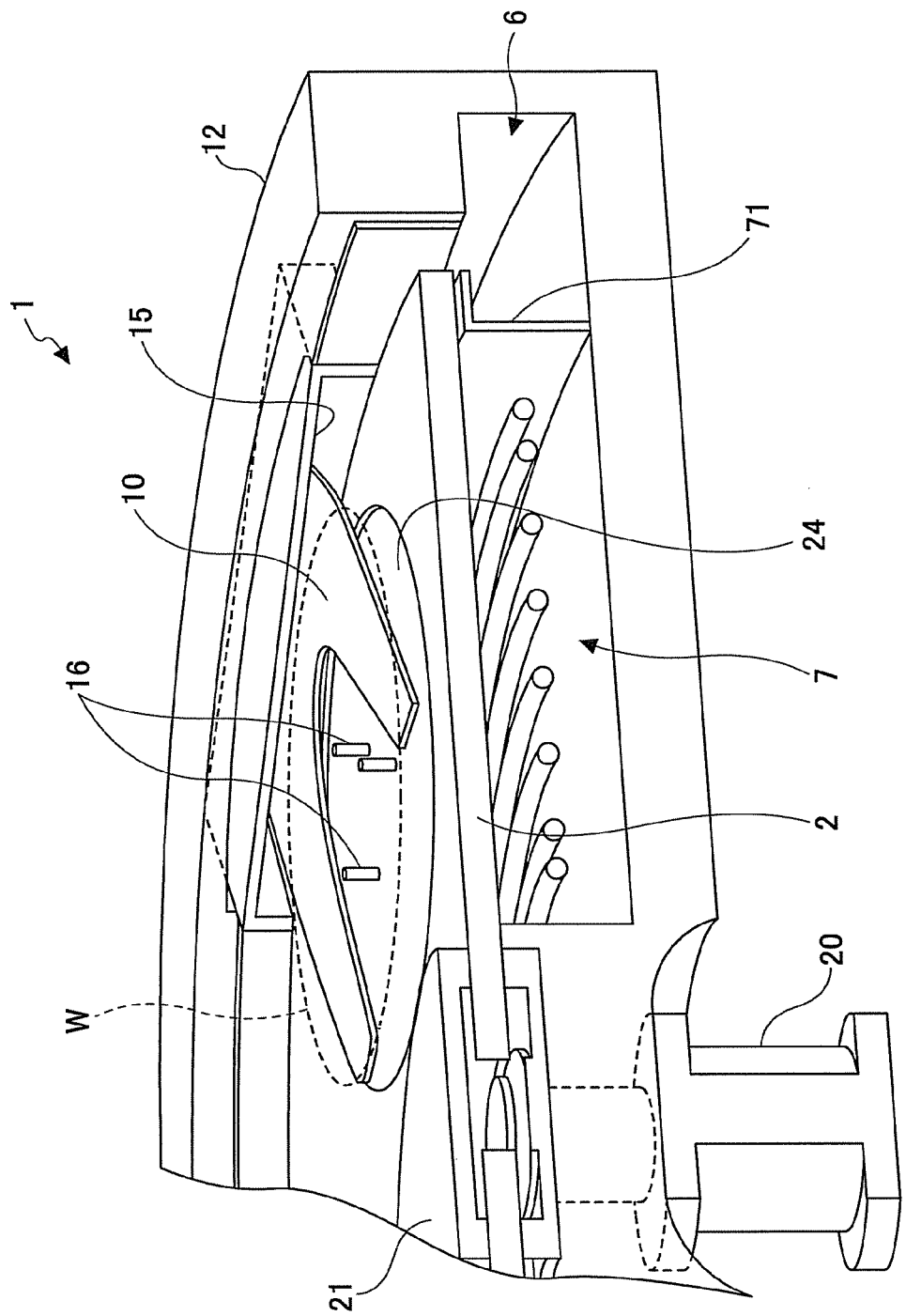
FIG. 10 is a partial broken view showing the film deposition apparatus in FIG. 1.

In addition, a transfer opening 15 is formed in a circumferential side wall of the chamber body 12 as shown in FIGS. 4, 5 and 10. Through the transfer opening 15, the wafer W is transferred into or out from the vacuum chamber 1 by a transfer arm 10 (FIGS. 5 and 10). The transfer opening 15 is provided with a gate valve (not shown) by which the transfer opening 5 is opened or closed. When the concave portion 24 of the susceptor 2 is in alignment with the transfer opening 15 and the gate valve is opened, the wafer W is transferred into the vacuum chamber 1 and placed in the concave portion 24 as a wafer receiving portion of the susceptor 2 from the transfer arm 10. In order to lower/raise the wafer W into/from the concave portion 24, there are provided elevation pins 16 that are raised or lowered through corresponding through holes formed in the concave portion 24 of the susceptor 2 by an elevation mechanism (not shown).

In addition, the film deposition apparatus according to this embodiment is provided with a control portion 100 that controls total operations of the deposition apparatus. The control portion 100 includes a process controller 100a formed of, for example, a computer, a user interface portion 100b, and a memory device 100c. The user interface portion 100b has a display that shows operations of the film deposition apparatus, and an input/output (I/O) device including a key board and a touch panel that allows an operator of the film deposition apparatus to select a process recipe and an administrator of the film deposition apparatus to change parameters in the process recipe. Moreover, the control portion 100 is connected to the temperature controllers (not shown) for the outer heater 7O, the center heater 7C, and controls the controllers the inner heater 7I and controls starting/stopping supplying the electrical power to and thus the temperatures of the outer heater 7O, the center heater 7C, and the inner heater 7I.

The memory device 100c stores a control program and a process recipe that cause the controlling portion 100 to carry out various operations of the deposition apparatus, and various parameters in the process recipe. These programs have groups of steps for carrying out the operations described later, for example. These programs are installed into and run by the process controller 100a by instructions from the user interface portion 100b. In addition, the programs are stored in a computer readable storage medium 100d and installed into the memory device 100c from the storage medium 100d. The computer readable storage medium 100d may be a hard disk, a compact disc, a magneto optical disk, a memory card, a floppy disk, or the like. Moreover, the programs may be downloaded to the memory device 100c through a communications network.

Next, operations of the film deposition apparatus according to this embodiment of the present invention are described. First, the susceptor 2 is rotated so that the concave portion 24 is in alignment with the transfer opening 15, and the gate valve (not shown) is open. Second, the wafer W is brought into the vacuum chamber 1 through the transfer opening 15 by the transfer arm 10. The wafer W is received by the elevation pins 16 and lowered to the concave portion 24 by the elevation pins 16 driven by the elevation mechanism (not shown) after the transfer arm 10 is pulled away from the vacuum chamber 1. Then, the series of operations above is repeated five times, and thus five wafers W are loaded on the susceptor 2. Next, the evacuation apparatus 64 (FIG. 1) is activated in order to maintain the vacuum chamber 1 at a predetermined reduced pressure. The susceptor 2 starts rotating clockwise when seen from above. The susceptor 2 is heated to a predetermined temperature (e.g., 300° C.) in advance by the heater unit 7 (the outer heater 7O, the center heater 7C, and the inner heater 7I), which in turn heats the wafers W on the susceptor 2. After the wafers W are heated and maintained at the predetermined temperature, which may be confirmed by a temperature sensor (not shown), the first reaction gas (BTBAS) is supplied to the first process area P1 through the first reaction gas nozzle 31, and the second reaction gas ($O_3$) is supplied to the second process area P2 through the second reaction gas nozzle 32. In addition, the separation gases ($N_2$) are supplied to the separation areas D through the separation nozzles 41, 42.

When the wafer W passes through the first process area P1 below the first reaction gas nozzle 31, BTBAS molecules are adsorbed on the surface of the wafer W, and when the wafer W pass through the second process area P2 below the second reaction gas nozzle 32, $O_3$ molecules are adsorbed on the surface of the wafer W, so that the BTBAS molecules are oxidized by the $O_3$ molecules. Therefore, when the wafer W passes through both areas P1, P2 with one rotation of the susceptor 2, one molecular layer of silicon dioxide is formed on the surface of the wafer W. Then, the wafer W alternates passing through areas P1, P2 plural times, and a silicon dioxide layer having a predetermined thickness is formed on the surfaces of the wafers W. After the silicon dioxide film having the predetermined thickness is deposited, the BTBAS gas and the $O_3$ gas are stopped, and the rotation of the susceptor 2 is stopped. Then, the wafer W is taken out from the vacuum chamber 1 in a manner opposite to when the wafer W is transferred into the vacuum chamber 1.

In addition, during the deposition operations above, the $N_2$ gas as the separation gas is supplied from the separation gas supplying pipe 51, and is ejected toward the top surface of the susceptor 2 from the center area C, that is, the gap 50 between the protrusion portion 5 and the susceptor 2. In this embodiment, a space below the second ceiling surface 45, where the reaction gas nozzle 31 (32) is arranged, has a lower pressure than the center area C and the thin space between the first ceiling surface 44 and susceptor 2. This is because the evacuation area 6 is provided adjacent to the space below the ceiling surface 45 (see FIGS. 1 and 5) and the space is directly evacuated through the evacuation area 6. Additionally, it is partly because the thin space is provided so that the height h can maintain the pressure difference between the thin space and the place where the reaction gas nozzle 31 (32) or the first (the second) process area P1 (P2) is located.

Figure 11:
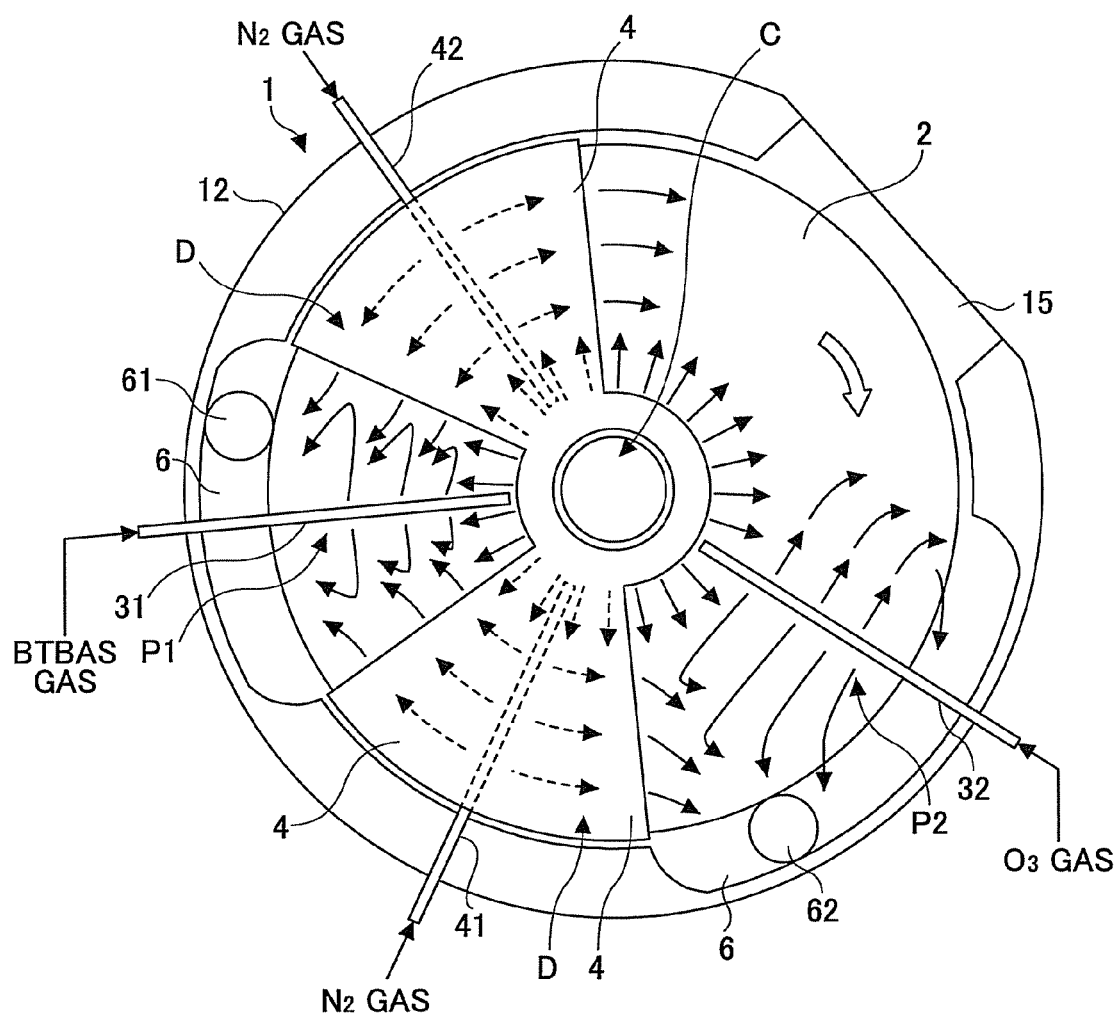
FIG. 11 shows a flow pattern of gases supplied to a vacuum chamber of the film deposition apparatus in FIG. 1.

Next, the flow patterns of the gases supplied into the vacuum chamber 1 from the gas nozzles 31, 32, 41, 42 are described in reference to FIG. 11, which schematically shows the flow patterns. As shown, part of the $O_3$ gas ejected from the second reaction gas nozzle 32 hits and flows along the top surface of the susceptor 2 (and the surface of the wafer W) in a direction opposite to the rotation direction of the susceptor 2. Then, the $O_3$ gas is pushed back by the $N_2$ gas flowing along the rotation direction, and changes the flow direction toward the edge of the susceptor 2 and the inner circumferential wall of the chamber body 12. Finally, this part of the $O_3$ gas flows into the evacuation area 6 and is evacuated from the vacuum chamber 1 through the evacuation port 62.

Another part of the $O_3$ gas ejected from the second reaction gas nozzle 32 hits and flows along the top surface of the susceptor 2 (and the surface of the wafers W) in the same direction as the rotation direction of the susceptor 2. This part of the $O_3$ gas mainly flows toward the evacuation area 6 due to the $N_2$ gas flowing from the center area C and suction force through the evacuation port 62. On the other hand, a small portion of this part of the $O_3$ gas flows toward the separation area D located downstream of the rotation direction of the susceptor 2 in relation to the second reaction gas nozzle 32 and may enter the gap between the ceiling surface 44 and the susceptor 2. However, because the height h of the gap is designed so that the $O_3$ gas is impeded from flowing into the gap at film deposition conditions intended, the small portion of the $O_3$ gas cannot flow into the gap. Even when a small fraction of the $O_3$ gas flows into the gap, the fraction of the $O_3$ gas cannot flow farther into the separation area D, because the fraction of the $O_3$ gas can be pushed backward by the $N_2$ gas ejected from the separation gas nozzle 41. Therefore, substantially all the part of the $O_3$ gas flowing along the top surface of the susceptor 2 in the rotation direction flows into the evacuation area 6 and is evacuated by the evacuation port 62, as shown in FIG. 11.

Similarly, part of the BTBAS gas ejected from the first reaction gas nozzle 31 to flow along the top surface of the susceptor 2 (and the surface of the wafers W) in a direction opposite to the rotation direction of the susceptor 2 is prevented from flowing into the gap between the susceptor 2 and the ceiling surface 44 of the convex portion 4 located upstream relative to the rotation direction of the susceptor 2 in relation to the first reaction gas supplying nozzle 31. Even if only a fraction of the BTBAS gas flows into the gap, this BTBAS gas is pushed backward by the $N_2$ gas ejected from the separation gas nozzle 41 in the separation area D. The BTBAS gas pushed backward flows toward the outer circumferential edge of the susceptor 2 and the inner circumferential wall of the chamber body 12, along with the $N_2$ gases from the separation gas nozzle 41 and the center area C, and then is evacuated by the evacuation port 61 through the evacuation area 6.

Another part of the BTBAS gas ejected from the first reaction gas nozzle 31 to flow along the top surface of the susceptor 2 (and the surface of the wafers W) in the same direction as the rotation direction of the susceptor 2 cannot flow into the gap between the susceptor 2 and the ceiling surface 44 of the convex portion 4 located downstream relative to the rotation direction of the susceptor 2 in relation to the first reaction gas supplying nozzle 31. Even if a fraction of this part of the BTBAS gas flows into the gap, this BTBAS gas is pushed backward by the $N_2$ gases ejected from the center area C and the separation gas nozzle 42 in the separation area D. The BTBAS gas pushed backward flows toward the evacuation area 6, along with the $N_2$ gases from the separation gas nozzle 41 and the center area C, and then is evacuated by the evacuation port 61.

As stated above, the separation areas D may prevent the BTBAS gas and the $O_3$ gas from flowing thereinto, or may greatly reduce the amount of the BTBAS gas and the $O_3$ gas flowing thereinto, or may push the BTBAS gas and the $O_3$ gas backward. The BTBAS molecules and the $O_3$ molecules adsorbed on the wafer W are allowed to go through the separation area D, contributing to the film deposition.

Additionally, the BTBAS gas in the first process area P1 (the $O_3$ gas in the second process area P2) is prevented from flowing into the center area C, because the separation gas is ejected toward the outer circumferential edge of the susceptor 2 from the center area C, as shown in FIGS. 9 and 11. Even if a fraction of the BTBAS gas in the first process area P1 (the $O_3$ gas in the second process area P2) flows into the center area C, the BTBAS gas (the $O_3$ gas) is pushed backward, so that the BTBAS gas in the first process area P1 (the $O_3$ gas in the second process area P2) is prevented from flowing into the second process area P2 (the first process area P1) through the center area C.

Moreover, the BTBAS gas in the first process area P1 (the $O_3$ gas in the second process area P2) is prevented from flowing into the second process area P2 (the first process area P1) through the space between the susceptor 2 and the inner circumferential wall of the chamber body 12. This is because the bent portion 46 is formed downward from the convex portion 4 so that the gaps between the bent portion 46 and the susceptor 2 and between the bent portion 46 and the inner circumferential wall of the chamber body 12 are as small as the height h of the ceiling surface 44 of the convex portion 4, the height being measured from the susceptor 2, thereby substantially avoiding pressure communication between the two process areas, as stated above. Therefore, the BTBAS gas is evacuated from the evacuation port 61, and the $O_3$ gas is evacuated from the evacuation port 62, and thus the two reaction gases are not mixed. In addition, the space below the susceptor 2 is purged by the $N_2$ gas supplied from the purge gas supplying pipes 72, 73. Therefore, the BTBAS gas cannot flow through below the susceptor 2 into the second process area P2.

An example of process parameters preferable in the film deposition apparatus according to this embodiment is listed below.
rotational speed of the susceptor 2: 1-500 rpm (in the case of the wafer W having a diameter of 300 mm)
pressure in the vacuum chamber 1: 1067 Pa (8 Torr)
wafer temperature: 350° C.
flow rate of BTBAS gas: 100 sccm
flow rate of $O_3$ gas: 10000 sccm
flow rate of $N_2$ gas from the separation gas nozzles 41, 42: 20000 sccm
flow rate of $N_2$ gas from the separation gas supplying pipe 51: 5000 sccm
the number of rotations of the susceptor 2: 600 rotations (depending on the film thickness required)

Experiments

Figure 12A:
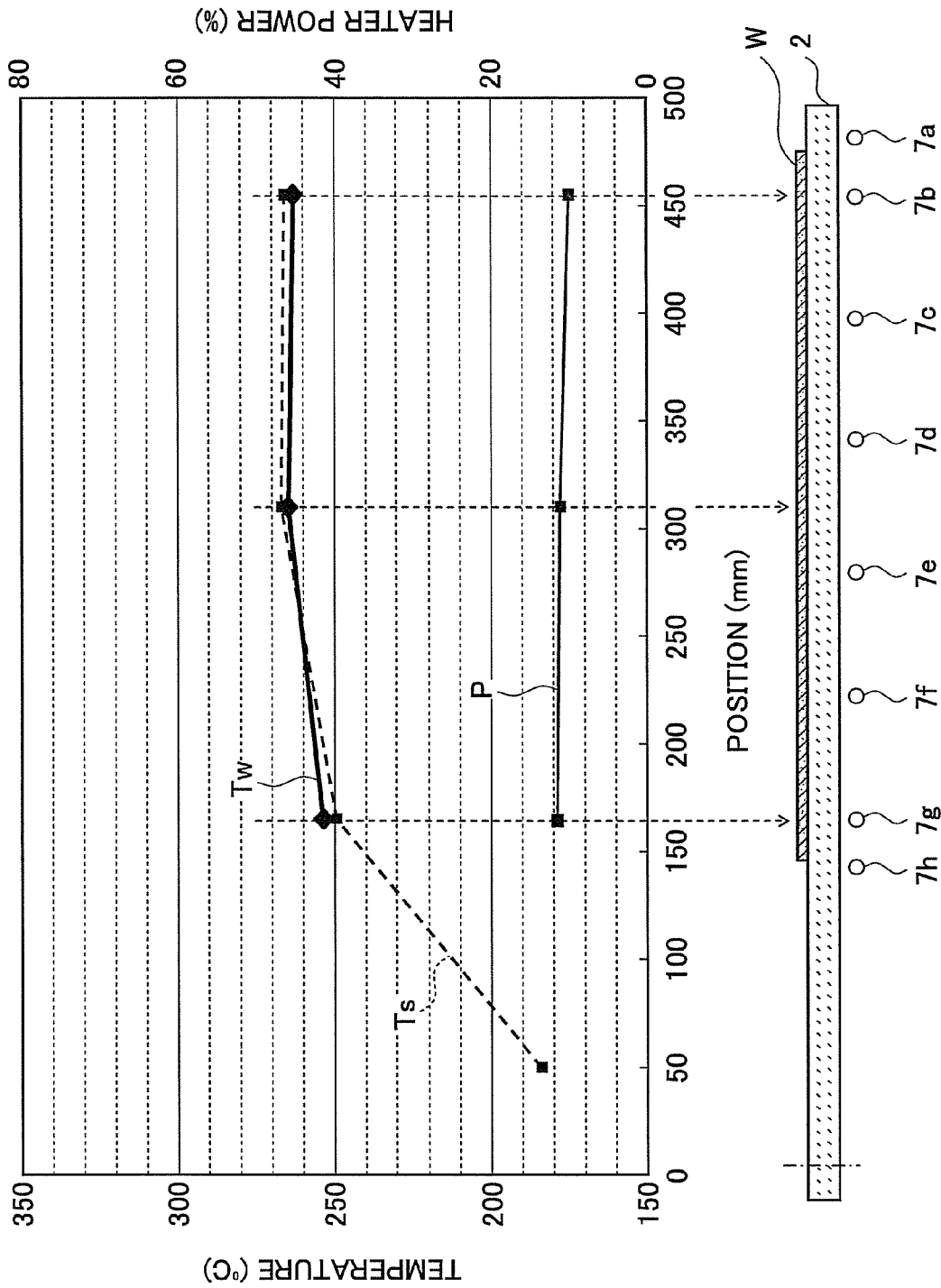
FIGS. 12A and 12B are graphs showing temperature distributions in a susceptor and a wafer that is placed on the susceptor.
Figure 12B:
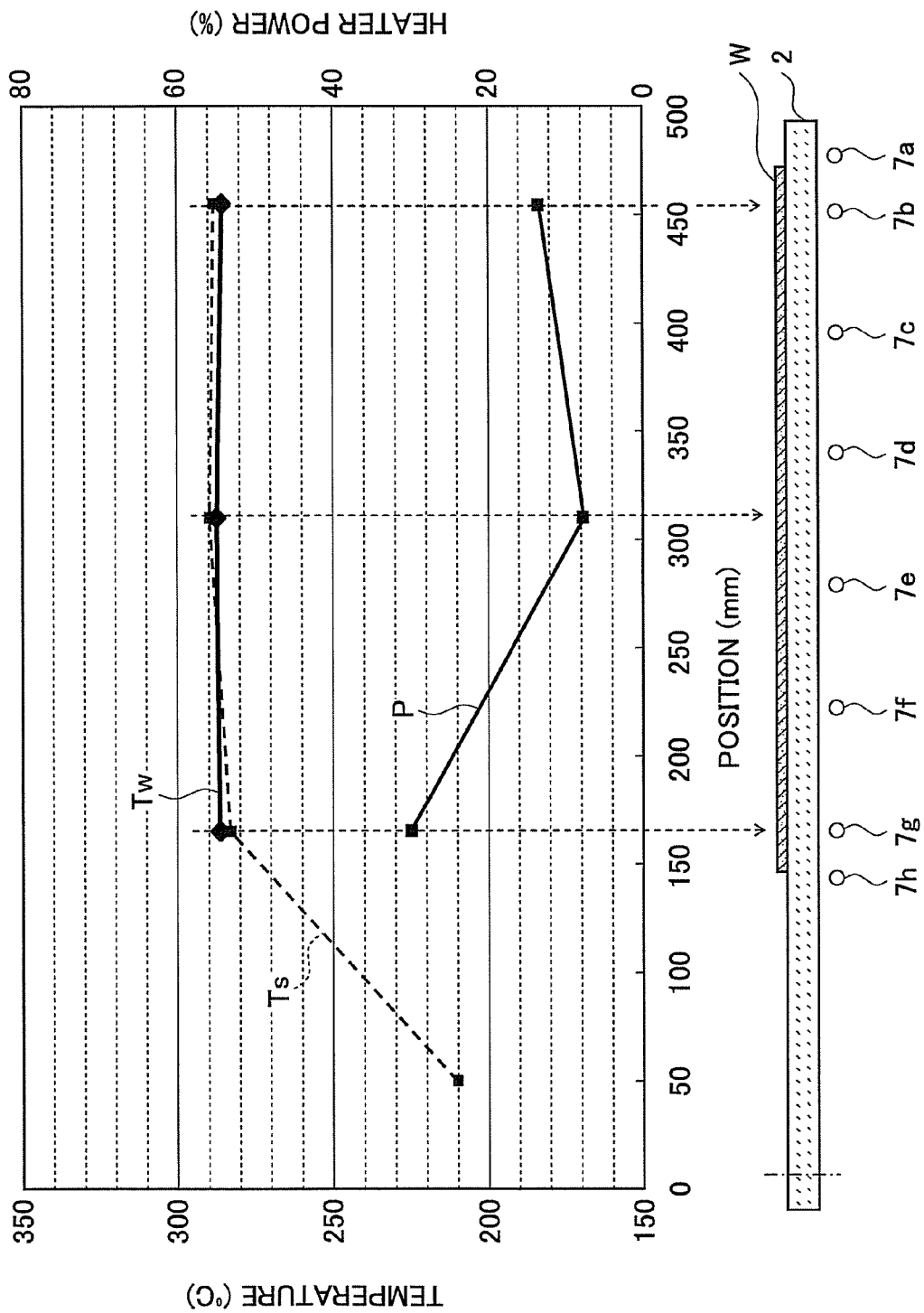

Next, results of experiments carried out in order to confirm an effect of the temperature controlling the susceptor 2 by the heater unit 7 are explained. FIGS. 12A, 12B are graphs showing temperature distribution across the susceptor 2 and the wafer W that is placed on the susceptor 2. In both graphs, the left vertical axis indicates a temperature of the susceptor 2 or the wafer W; the right vertical axis indicates electrical power supplied to the heater unit 7 in percentage (%) with respect to a rated value; and the horizontal axis indicates a distance from the center of the susceptor 2. Below the horizontal axis, the susceptor 2, the wafer W placed on the susceptor 2, and the heater elements $7a$ through $7h$ of the heater unit 7 are schematically illustrated.

In addition, a solid line Tw represents a temperature of the wafer W on the susceptor 2 in both graphs. Specifically, temperatures have been measured at a left edge portion, a center portion, and a right edge portion of the wafer W on the susceptor 2, as shown by closed diamonds in the graphs. When measuring the temperatures, a test wafer having thermocouples arranged in the corresponding portions was used to directly measure the temperatures of the wafer.

On the other hand, a dashed line Ts represents a temperature of the upper surface of the susceptor 2, which is measured without the wafer W on the susceptor 2 in both graphs. Three of four measurement plots (closed squares) indicate temperatures measured at the left edge portion, the center portion, and the right edge portion of the wafer W. The remaining plot indicates a temperature measured at a position about 50 mm away from the rotation center of the susceptor 2. These measurements were carried out using a ceiling plate 11 having view ports and corresponding radiation thermometers specially prepared for the experiments.

In addition, a solid line P indicates electrical power (an average value of the electrical power supplied to the heater elements) supplied to the outer heater 7O (heater elements $7a$, $7b$), the center heater 7C (heater elements $7c$ through $7f$), and the inner heater 7I (heater elements $7g$, $7h$).

Referring to FIG. 12A, when the electrical power supplied to the outer heater 7O, the center heater 7C, and the inner heater 7I is substantially constant at about 10 to 12% of the rated value, the temperatures of the upper surface of the susceptor 12 and the wafer W tend to decrease toward the center portion from the outer circumference of the susceptor 2. Specifically, the temperature of the upper surface of the susceptor 2 is decreased at the position about 50 mm away from the center by about 80° C. This may be because the heat of the susceptor 2 around the position is dissipated through the core portion 21 (FIG. 1) that supports the susceptor 2.

On the other hand, when electrical power supplied to the inner heater 7I (heater elements $7g$, $7h$) is increased, the temperature of the wafer W becomes more uniform, as shown in FIG. 12B. In addition, the temperature of the upper surface of the susceptor 2 becomes uniform in an area where the wafer W is placed. As shown, when the outer heater 7O, the center heater 7C, and the inner heater 7I are independently controlled in such a manner, the temperature uniformity across the wafer can be improved.

As stated above, because the heater unit 7 is divided along its radius direction into the outer heater 7O, the center heater 7C, and the inner heater 7I, which can be independently controlled, in the film deposition apparatus according to this embodiment, the temperature uniformity across the susceptor 2 can be improved, thereby improving the temperature uniformity across the wafer W placed on the susceptor 2.

In the above experiment, while the test wafer with the thermocouples attached thereon was used, the same results can be obtained even when the thermocouples 8O, 8C, 8I are used in order to confirm the temperature uniformity in FIG. 12A.

In addition, because the film deposition apparatus according to this embodiment includes a separation area D between the first process area P1, to which the BTBAS gas is supplied, and the second process area P2, to which the $O_3$ gas is supplied, the BTBAS gas (the $O_3$ gas) is impeded from flowing into the second process area P2 (the first process area P1) and being mixed with the $O_3$ gas (the BTBAS gas). Therefore, an MLD (or ALD) mode deposition of silicon dioxide is assuredly performed by rotating the susceptor 2 on which the wafers W are placed in order to allow the wafers W to pass through the first process area 21, the separation area D, the second process area P2, and the separation area D. In addition, the separation areas D further include the separation gas nozzles 41, 42 from which the $N_2$ gases are ejected in order to further assuredly impede the BTBAS gas (the $O_3$ gas) from flowing into the second process area P2 (the first process area P1) and being mixed with the $O_3$ gas (the BTBAS gas). Moreover, because the vacuum chamber 1 of the film deposition apparatus according to this embodiment has the center area C having the ejection holes from which the $N_2$ gas is ejected, the BTBAS gas (the $O_3$ gas) is impeded from flowing into the second process area P2 (the first process area P1) through the center area C and being mixed with the $O_3$ gas (the BTBAS gas). Furthermore, because the BTBAS gas and the $O_3$ gas are not mixed, almost no deposits of silicon dioxide are made on the susceptor 2, thereby reducing particle problems.

Although the susceptor 2 has the five concave portions 24 and five wafers W placed in the corresponding concave portions 24 can be processed in one run in this embodiment, only one wafer W is placed in one of the five concave portions 24, or the susceptor 2 may have only one concave portion 24.

The reaction gases that may be used in the film deposition apparatus according to an embodiment of the present invention are dichlorosilane (DCS), hexachlorodisilane (HCD), Trimethyl Aluminum (TMA), tetrakis-ethyl-methyl-amino-zirconium (TEMAZr), tris(dimethyl amino) silane (3DMAS), tetrakis-ethyl-methyl-amino-hafnium (TEMHf), bis (tetra methyl heptandionate) strontium $(Sr(THD)_2)$, (methyl-pentadionate)(bis-tetra-methyl-heptandionate) titanium (Ti(MPD) (THD)), monoamino-silane, or the like.

Because a larger centrifugal force is applied to the gases in the vacuum chamber 1 at a position closer to the outer circumference of the susceptor 2, the BTBAS gas, for example, flows toward the separation area D at a higher speed in the position closer to the outer circumference of the susceptor 2. Therefore, the BTBAS gas is more likely to enter the gap between the ceiling surface 44 and the susceptor 2 in the position closer to the circumference of the susceptor 2. Because of this situation, when the convex portion 4 has a greater width (a longer arc) toward the circumference, the BTBAS gas cannot flow farther into the gap in order to be mixed with the $O_3$ gas. In view of this, it is preferable for the convex portion 4 to have a sector-shaped top view, as explained in the above embodiment.

Figure 13A:
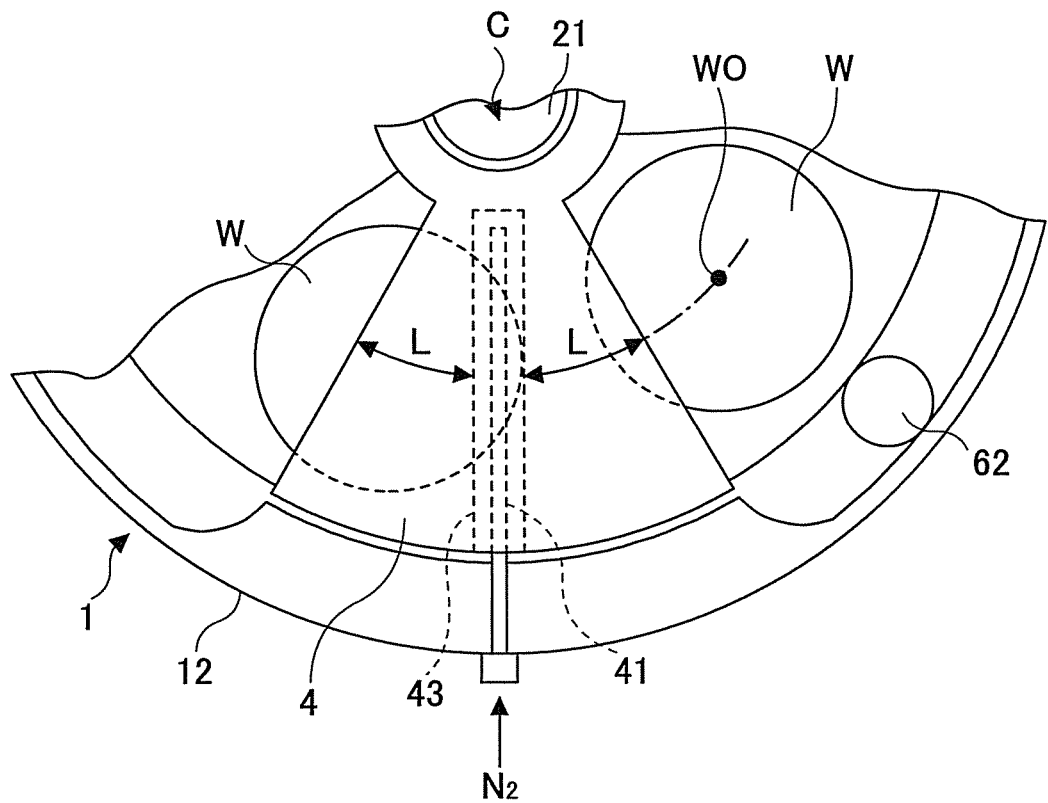
FIGS. 13A and 13B are a partial plan view and a partial cross-sectional view, respectively, for explaining a size of a convex portion of the film deposition apparatus in FIG. 1.
Figure 13B:
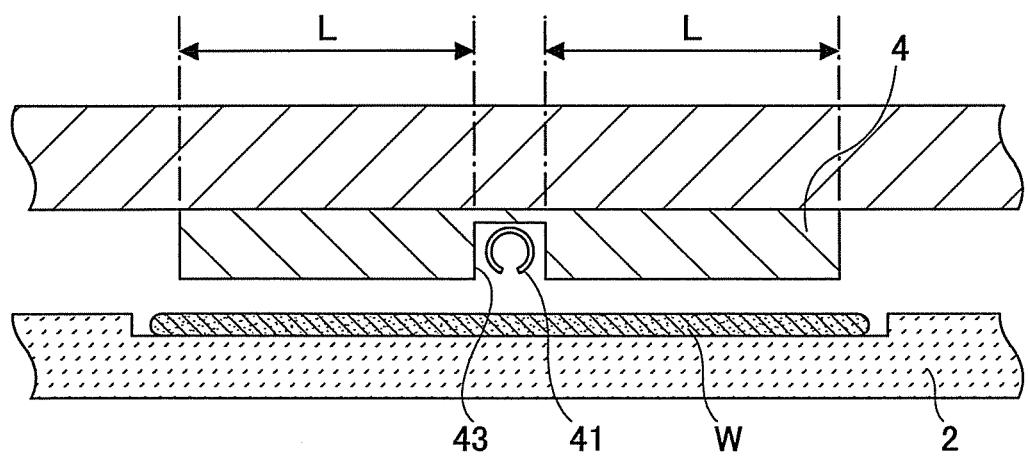

The size of the convex portion 4 (or the ceiling surface 44) is exemplified again below. Referring to FIGS. 13A and 13B, the ceiling surface 44 that creates the thin space in both sides of the separation gas nozzle 41 (42) may preferably have a length L ranging from about one-tenth of a diameter of the wafer W through about a diameter of the wafer W, preferably, about one-sixth or more of the diameter of the wafer W along an arc that corresponds to a route through which a wafer center WO passes. Specifically, the length L is preferably about 50 mm or more when the wafer W has a diameter of 300 mm. When the length L is small, the height h of the thin space between the ceiling surface 44 and the susceptor 2 (wafer W) has to be accordingly small in order to effectively prevent the reaction gases from flowing into the thin space. However, when the length L becomes too small and thus the height h has to be extremely small, the susceptor 2 may hit the ceiling surface 44, which may cause wafer breakage and wafer contamination through particle generation. Therefore, measures to damp vibration of the susceptor 2 or measures to stably rotate the susceptor 2 are required in order to prevent the susceptor 2 hitting the ceiling surface 44. On the other hand, when the height h of the thin space is kept relatively greater while the length L is small, a rotation speed of the susceptor 2 has to be lower in order to avoid the reaction gases flowing into the thin gap between the ceiling surface 44 and the susceptor 2, which is rather disadvantageous in terms of production throughput. From these considerations, the length L of the ceiling surface 44 along the arc corresponding to the route of the wafer center WO is preferably about 50 mm or more when the wafers W having a diameter of 300 mm are processed, as stated above. However, the size of the convex portion 4 or the ceiling surface 44 is not limited to the above size, but may be adjusted depending on the process parameters and the size of the wafer to be used. In addition, as clearly understood from the above explanation, the height h of the thin space may be adjusted depending on an area of the ceiling surface 44 in addition to the process parameters and the size of the wafer to be used, as long as the thin space has a height that allows the separation gas to flow from the separation area D through the process area P1 (P2).

Figure 14:
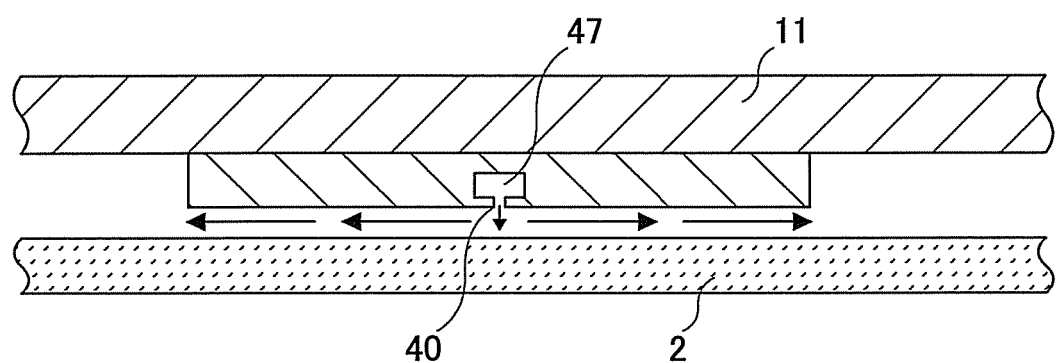
FIG. 14 is a partial broken view showing a modification example of the convex portion of the film deposition apparatus in FIG. 1.

The separation gas nozzle 41 (42) is located in the groove portion 43 formed in the convex portion 4 and the lower ceiling surfaces 44 are located in both sides of the separation gas nozzle 41 (42) in the above embodiment. However, as shown in FIG. 14, a conduit 47 extending along the radial direction of the susceptor 2 may be made inside the convex portion 4, instead of the separation gas nozzle 41 (42), and plural holes 40 may be formed along the longitudinal direction of the conduit 47 so that the separation gas ($N_2$ gas) may be ejected from the plural holes 40 in other embodiments.

Figure 15A:
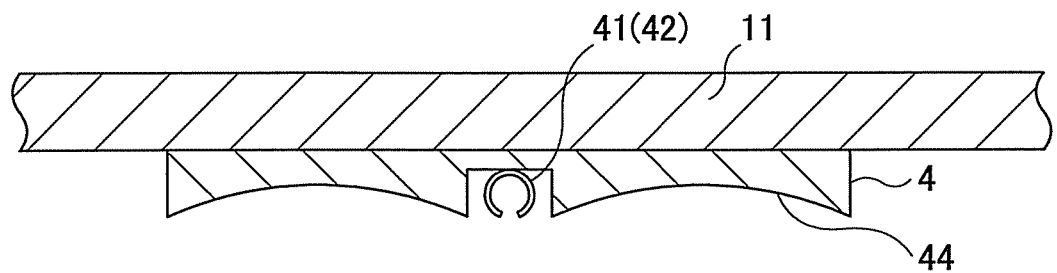
FIGS. 15A through 15C are cross-sectional views showing modification examples of the convex portion of the film deposition apparatus in FIG. 1.
Figure 15B:
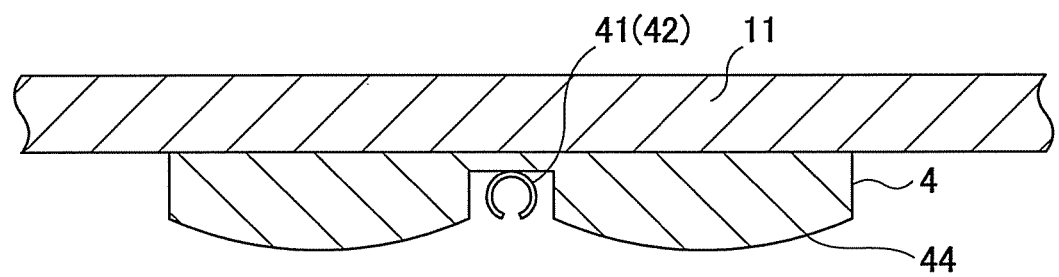
Figure 15C:
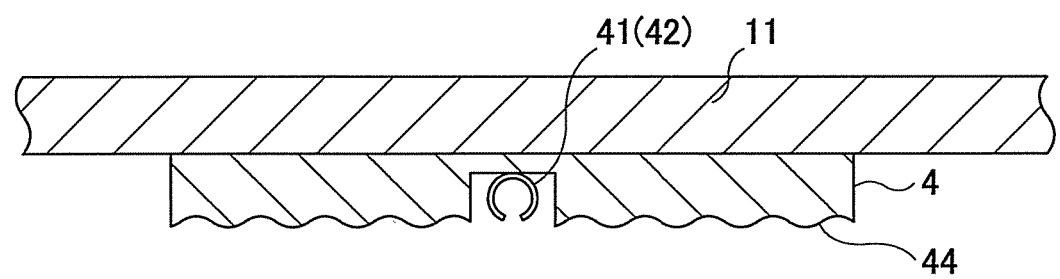

The ceiling surface 44 of the separation area D is not necessarily flat in other embodiments. For example, the ceiling surface 44 may be concavely curved as shown in FIG. 15A, convexly curved as shown in FIG. 15B, or corrugated as shown in FIG. 15C.

In addition, the convex portion 4 may be hollow and the separation gas may be introduced into the hollow convex portion 4. In this case, the plural gas ejection holes 33 may be arranged as shown in FIGS. 16A, 16B, 16C.

Figure 16A:
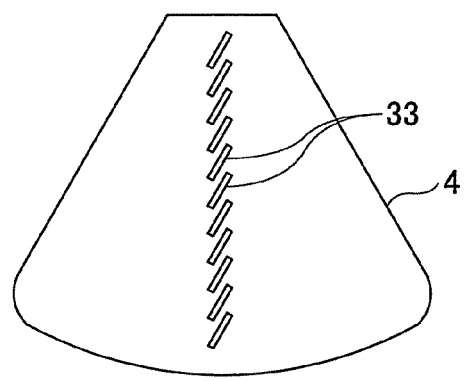
FIGS. 16A through 16C show modification examples of convex portion of the film deposition apparatus in FIG. 1.
Figure 16B:
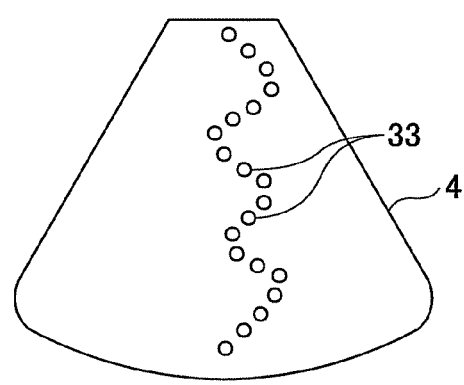
Figure 16C:
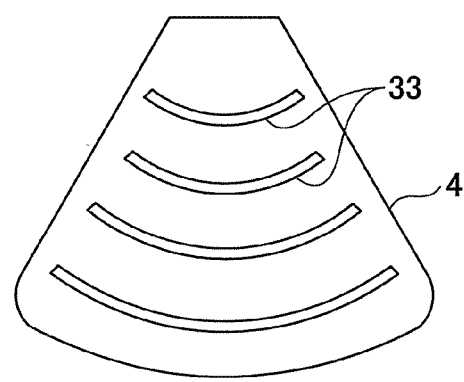

Referring to FIG. 16A, the plural gas ejection holes 33 each have a shape of a slanted slit. These slanted slits (gas ejection holes 33) are arranged to be partially overlapped with an adjacent slit along the radial direction of the susceptor 2. In FIG. 16B, the plural gas ejection holes 33 are circular. These circular holes (gas ejection holes 33) are arranged along a winding line that extends in the radial direction as a whole. In FIG. 16C, each of the plural gas ejection holes 33 has the shape of an arc-shaped slit. These arc-shaped slits (gas ejection holes 33) are arranged at predetermined intervals in the radial direction.

Figure 17A:
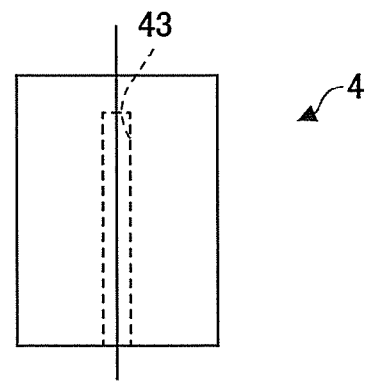
FIGS. 17A through 17D show other modification examples of the convex portion of the film deposition apparatus in FIG. 1.
Figure 17B:
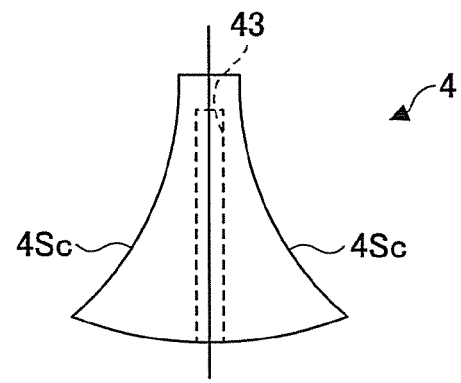
Figure 17C:
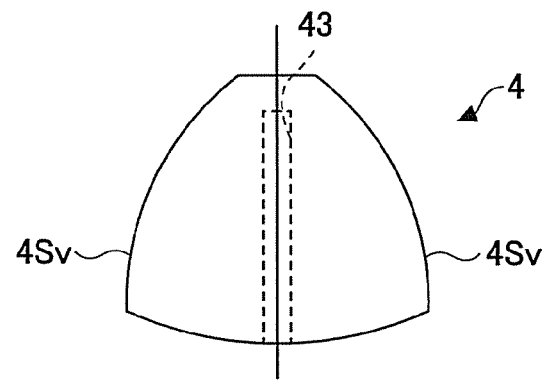
Figure 17D:
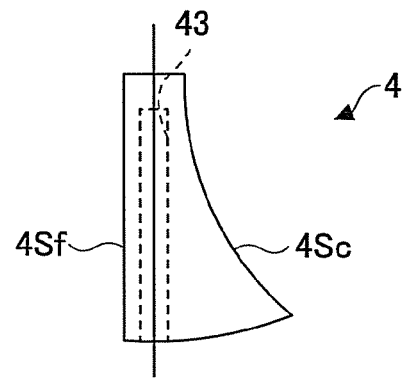

While the convex portion 4 has the sector-shaped top view shape in this embodiment, the convex portion 4 may have a rectangle top view shape as shown in FIG. 17A, or a square top view shape in other embodiments. Alternatively, the convex portion 4 may be sector-shaped as a whole in the top view and have concavely curved side surfaces 45c, as shown in FIG. 17B. In addition, the convex portion 4 may be sector-shaped as a whole in the top view and have convexly curved side surfaces 45v, as shown in FIG. 17C. Moreover, an upstream portion of the convex portion 4 relative to the rotation direction of the susceptor 2 (FIG. 1) may have a concavely curved side surface 45c and a downstream portion of the convex portion 4 relative to the rotation direction of the susceptor 2 (FIG. 1) may have a flat side surface 45f, as shown in FIG. 17D. Incidentally, dotted lines in FIGS. 17A through 17D represent the groove portions 43. In these cases, the separation gas nozzle 41 (42), which is housed in the groove portion 43, extends from the center portion of the vacuum chamber 1, for example, from the protrusion portion 5.

In addition, the heater unit 7 for heating the wafer W may be composed of a spiral heater element instead of the ring-shaped heater element. In this case, one spiral heater element with two turns may be used instead of the outer heater 7O having the heater elements 7a, 7b; one spiral heater element with four turns may be used instead of the center heater 7C having the heater elements 7c through 7f; and one spiral heater element with two turns may be used instead of the inner heater 7I having the heater elements 7g, 7h. The number of turns of the spiral heater element is not limited to the above but may be arbitrarily changed. In addition, the heater unit 7 may be composed of a heat lamp. In this case, plural ring-shaped lamps may be arranged respectively along three concentric circles having a center at the rotation center of the susceptor 2, so that three zones such as an outer zone, a center zone, and an inner zone arranged along a radius direction are independently controlled in terms of temperature, thereby improving the temperature uniformity. Moreover, the heater unit 7 may be arranged above rather than below the susceptor 2, or both. Furthermore, the heater unit 7 may be divided into two areas (zones), or four or more areas (zones).

Moreover, platinum resistance temperature sensors or thermistors may be used instead of the thermocouples 8O, 8C, 8I.

Figure 18:
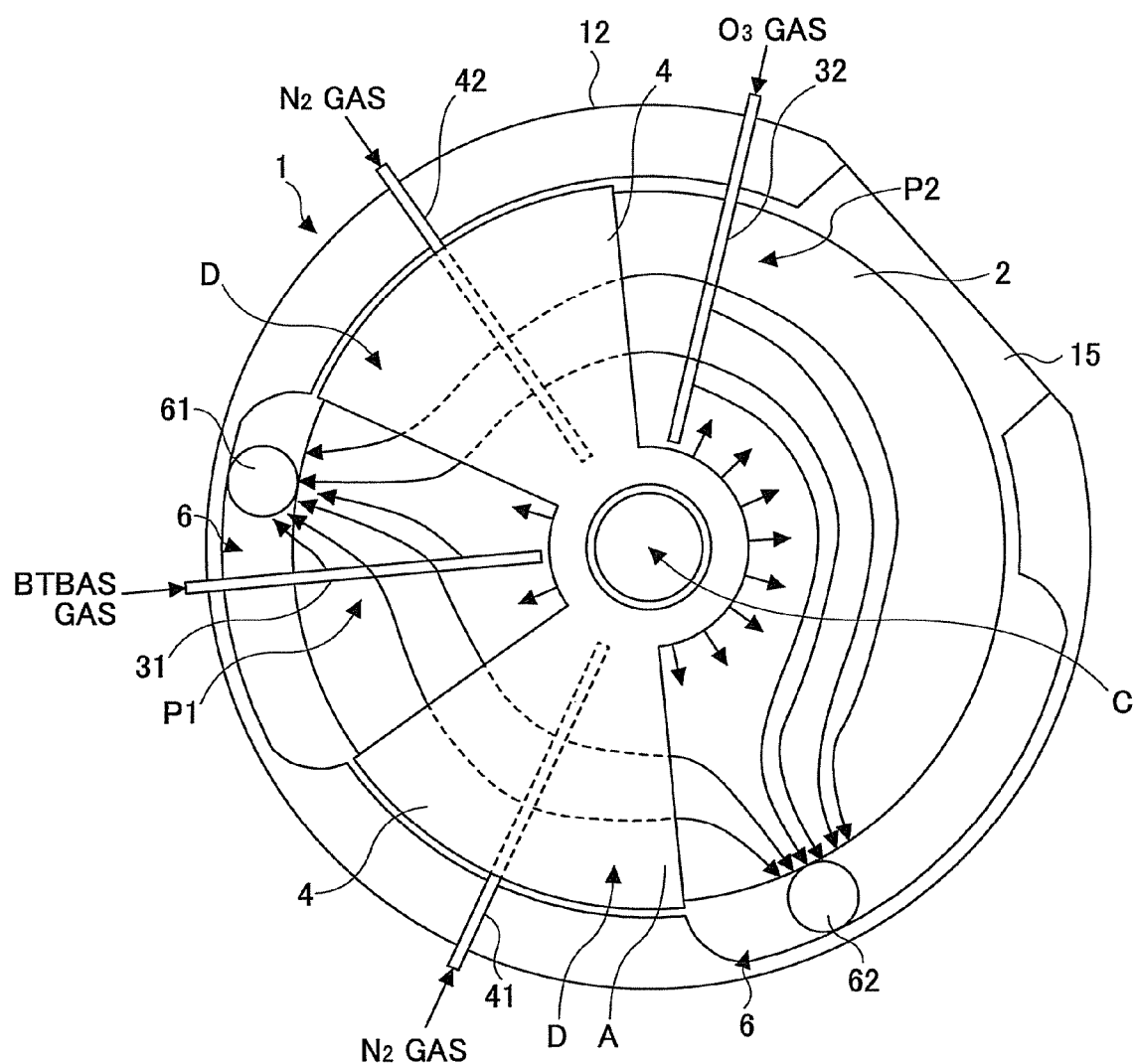
FIG. 18 is a plan view showing another arrangement of reaction gas nozzles.

The process areas P1, P2 and the separation area D may be arranged as shown in FIG. 18 in other embodiments. Referring to FIG. 18, the second reaction gas nozzle 32 for supplying the second reaction gas (e.g., $O_3$ gas) is located at upstream of the rotation direction relative to the transfer opening 15, or between the separation gas nozzle 42 and the transfer opening 15. Even in such an arrangement, the gases ejected from the nozzle 31, 32, 41, 42 and the center area C flow generally along arrows shown in FIG. 18, so that the first reaction gas and the second reaction gas cannot be mixed. Therefore, a proper ALD (or MLD) mode film deposition can be realized by such an arrangement.

Figure 19:
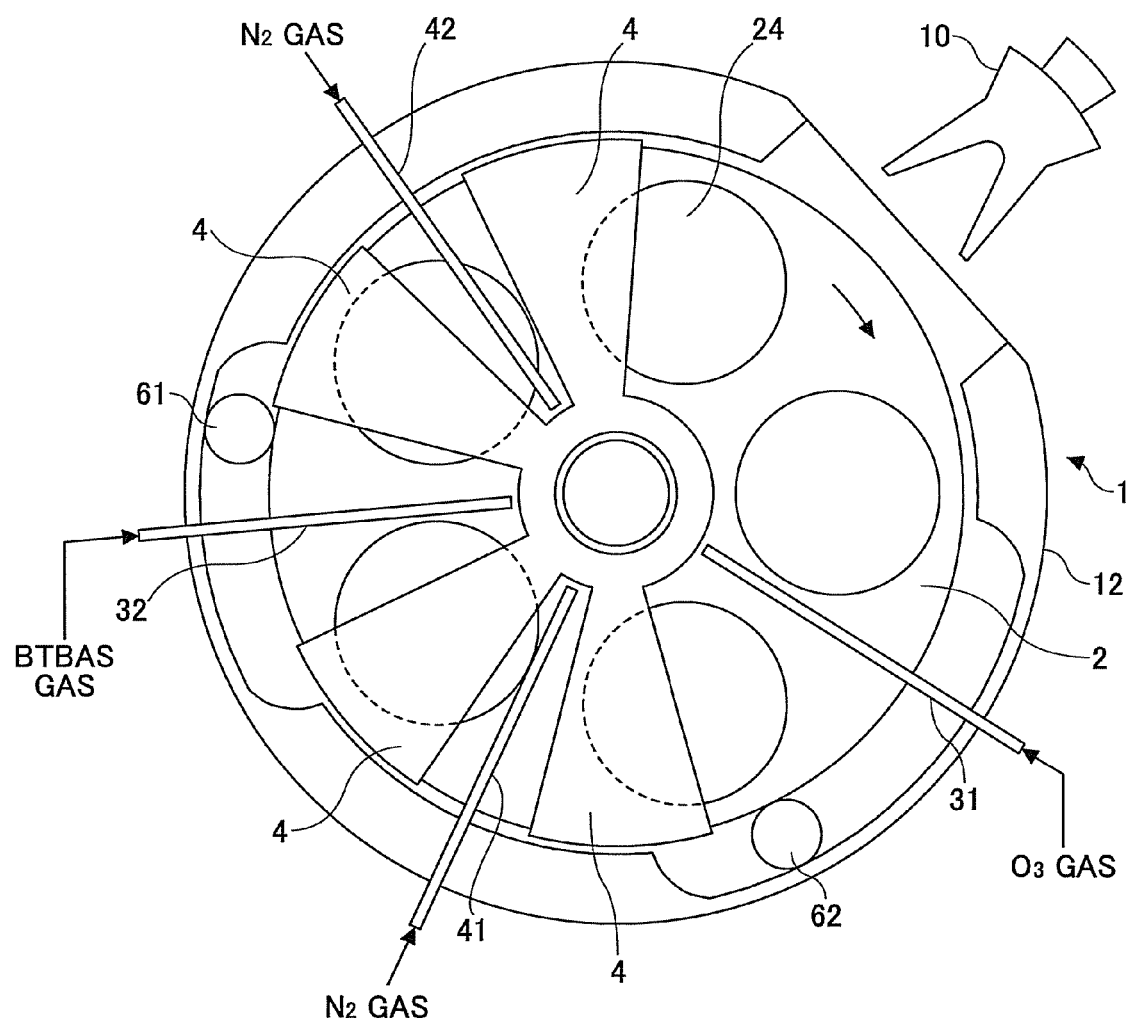
FIG. 19 is a plan view of a modification example of the convex portion of the film deposition apparatus in FIG. 1.

In addition, the separation area D may be configured by attaching two sector-shaped plates on the bottom surface of the ceiling plate 1 by screws so that the two sector-shaped plates are located on both sides of the separation gas nozzle 41 (42), as stated above. FIG. 19 is a plan view of such a configuration. In this case, the distance between the convex portion 4 and the separation gas nozzle 41 (42), and the size of the convex portion 4 can be determined taking into consideration ejection rates of the separation gas and the reaction gas in order to effectively demonstrate the separation function of the separation area D.

Figure 20:
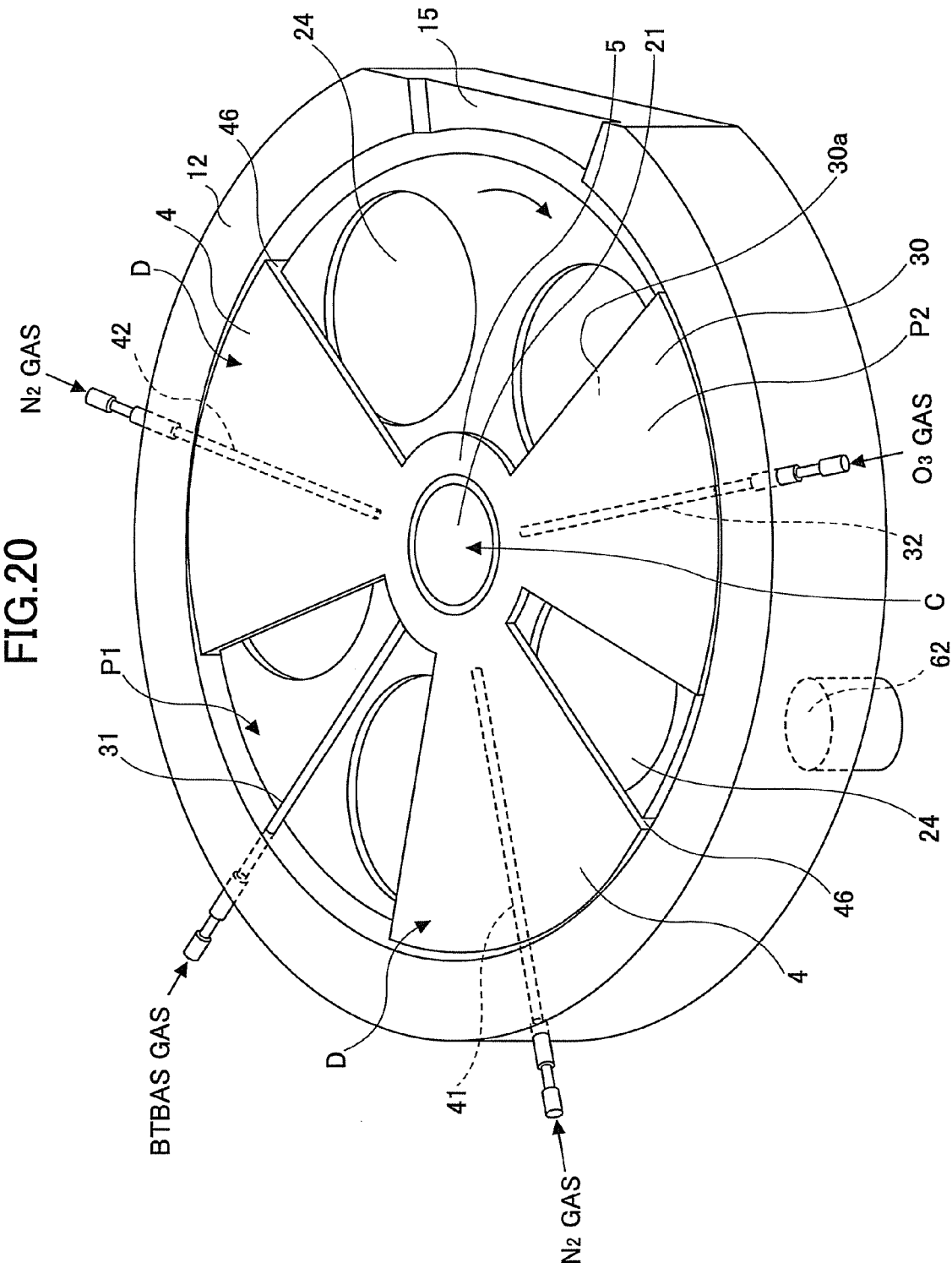
FIG. 20 is a perspective view of another modification example of the convex portion of the film deposition apparatus in FIG. 1.

In the above embodiment, the first process area P1 and the second process area P2 correspond to the areas having the ceiling surface 45 higher than the ceiling surface 44 of the separation area D. However, at least one of the first process area P1 and the second process area P2 may have another ceiling surface that opposes the susceptor 2 in both sides of the reaction gas supplying nozzle 31 (32) and is lower than the ceiling surface 45 in order to prevent gas from flowing into a gap between the ceiling surface concerned and the susceptor 2. This ceiling surface, which is lower than the ceiling surface 45, may be as low as the ceiling surface 44 of the separation area D. FIG. 20 shows an example of such a configuration. As shown, a sector-shaped convex portion 30 is located in the second process area P2, where $O_3$ gas is adsorbed on the wafer W, and the reaction gas nozzle 32 is located in the groove portion (not shown) formed in the convex portion 30. In other words, this second process area P2 shown in FIG. 20 is configured in the same manner as the separation area P, while the gas nozzle is used in order to supply the reaction gas. In addition, the convex portion 30 may be configured as a hollow convex portion, an example of which is illustrated in FIGS. 16A through 16C.

Figure 21:
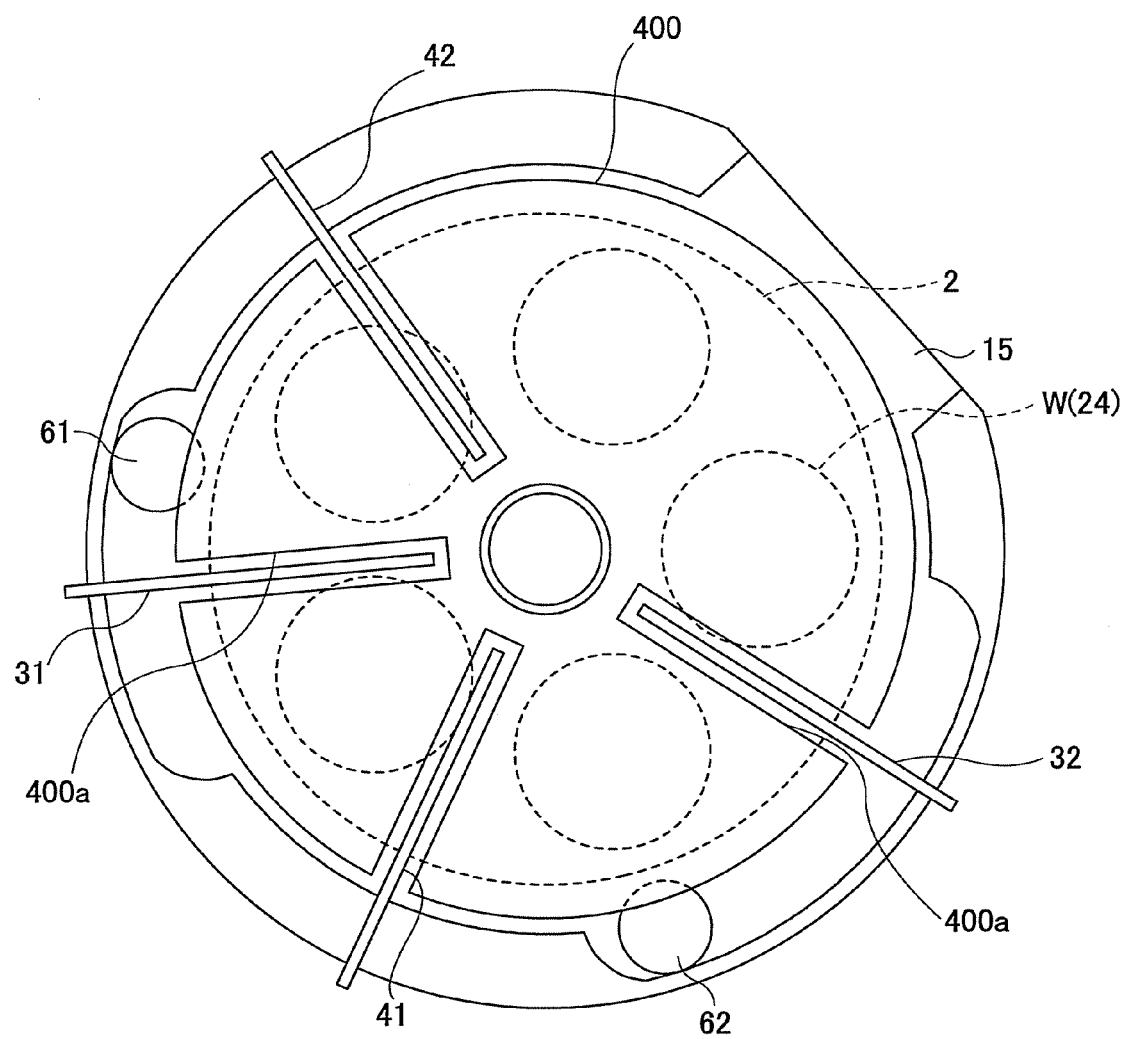
FIG. 21 is a plan view of yet another modification example of the convex portion of the film deposition apparatus in FIG. 1.

Moreover, the ceiling surface, which is lower than the ceiling surface 45 and as low as the ceiling surface 44 of the separation area X, may be provided for both reaction gas nozzles 31, 32 and extended to reach the ceiling surfaces 44 in other embodiments, as shown in FIG. 21, as long as the low ceiling surfaces 44 are provided on both sides of the reaction gas nozzle 41 (42). In other words, another convex portion 400 may be attached on the bottom surface of the ceiling plate 11, instead of the convex portion 4. The convex portion 400 has a shape of a substantially circular plate, opposes substantially the entire top surface of the susceptor 2, has four slots 400a where the corresponding gas nozzles 31, 32, 41, 42 are housed, the slots 400a extending in a radial direction, and leaves a thin space below the convex portion 400 in relation to the susceptor 2. A height of the thin space may be comparable with the height h stated above. When the convex portion 400 is employed, the reaction gas ejected from the reaction gas nozzle 31 (32) diffuses to both sides of the reaction gas nozzle 31 (32) below the convex portion 400 (or in the thin space) and the separation gas ejected from the separation gas nozzle 41 (42) diffuses to both sides of the separation gas nozzle 41 (42). The reaction gas and the separation gas flow into each other in the thin space and are evacuated through the evacuation port 61 (62). Even in this case, the reaction gas ejected from the reaction gas nozzle 31 cannot be mixed with the other reaction gas ejected from the reaction gas nozzle 32, thereby realizing a proper ALD (or MLD) mode film deposition.

The convex portion 400 may be configured by combining the hollow convex portions 4 shown in any of FIGS. 16A through 16C in order to eject the reaction gases and the separation gases from the corresponding ejection holes 33 in the corresponding hollow convex portions 4 without using the gas nozzles 31, 32, 41, 42 and the slots 400a.

Modification Example of the First Embodiment

Figure 22:
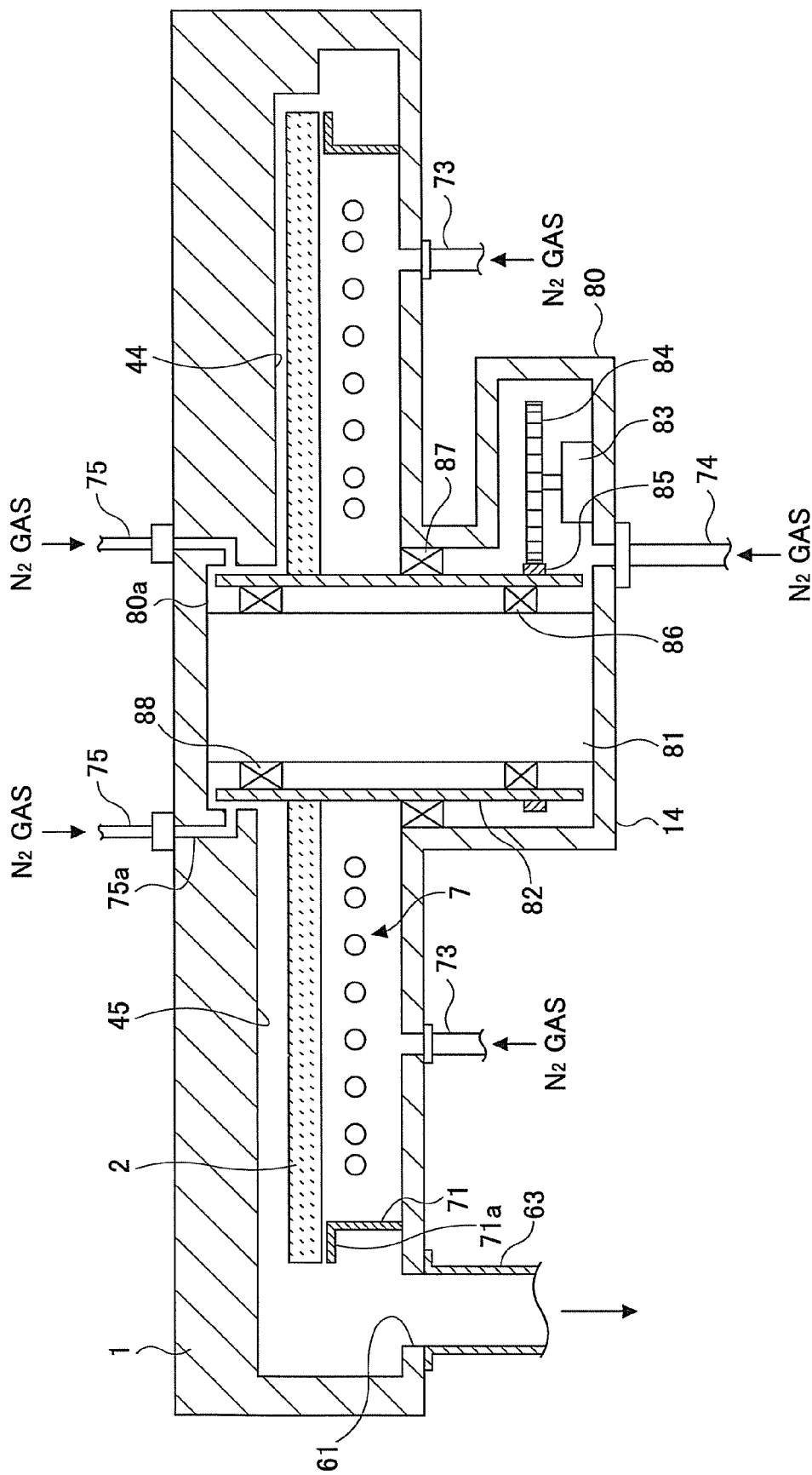
FIG. 22 is a cross-sectional view of a modification example of the first embodiment.

In the above embodiments, the rotational shaft 22 for rotating the susceptor 2 is located in the center portion of the vacuum chamber 1. In addition, the space 52 between the core portion 21 and the ceiling plate 11 is purged with the separation gas in order to prevent the reaction gases from being mixed through the center portion. However, the vacuum chamber 1 may be configured as shown in FIG. 22 in other embodiments. Referring to FIG. 22, the bottom portion 14 of the chamber body 12 has a center opening to which a housing case 80 is hermetically attached. Additionally, the ceiling plate 11 has a center concave portion 80a. A pillar 81 is placed on the bottom surface of the housing case 80, and a top end portion of the pillar 81 reaches a bottom surface of the center concave portion 80a. The pillar 81 can prevent the first reaction gas (BTBAS) ejected from the first reaction gas nozzle 31 and the second reaction gas ($O_3$) ejected from the second reaction gas nozzle 32 from being mixed through the center portion of the vacuum chamber 1.

In addition, a rotation sleeve 82 is provided so that the rotation sleeve 82 coaxially surrounds the pillar 81. The rotation sleeve 82 is supported by bearings 86, 88 attached on an outer surface of the pillar 81 and a bearing 87 attached on an inner side wall of the housing case 80. Moreover, the rotation sleeve 82 has a gear portion 85 formed or attached on an outer surface of the rotation sleeve 82. Furthermore, an inner circumference of the ring-shaped susceptor 2 is attached on the outer surface of the rotation sleeve 82. A driving portion 83 is housed in the housing case 80 and has a gear 84 attached to a shaft extending from the driving portion 83. The gear 84 is meshed with the gear portion 85. With such a configuration, the rotation sleeve 82 and thus the susceptor 2 are rotated by a driving portion 83. Namely, the film deposition apparatus of FIG. 22 includes the pillar 81 provided between the upper inner surface and the bottom surface of the vacuum chamber 1 in the center of the vacuum chamber 1, and the rotation sleeve 82 inside of which the pillar 81 is arranged. The rotation sleeve 82 serves as a rotational shaft for the susceptor 2.

A purge gas supplying pipe 74 is connected to an opening formed in a bottom of the housing case 80, so that a purge gas is supplied into the housing case 80. With this, an inner space of the housing case 80 may be kept at a higher pressure than an inner space of the vacuum chamber 1, in order to prevent the reaction gases from flowing into the housing case 80. Therefore, no film deposition takes place in the housing case 80, thereby reducing maintenance frequencies. In addition, purge gas supplying pipes 75 are connected to corresponding conduits 75a that reach from an upper outer surface of the vacuum chamber 1 to an inner side wall of the concave portion 80a, so that a purge gas is supplied toward an upper end portion of the rotation sleeve 82. Because of the purge gas, the BTBAS gas and the $O_3$ gas cannot be mixed through a space between the outer surface of the rotation sleeve 82 and the side wall of the concave portion 80a. Although the two purge gas supplying pipes 75 are illustrated in FIG. 22, the number of the pipes 75 and the corresponding conduits 75a may be determined so that the purge gas from the pipes 75 can assuredly avoid gas mixture of the BTBAS gas and the $O_3$ gas in and around the space between the outer surface of the rotation sleeve 82 and the side wall of the concave portion 80a.

In the embodiment illustrated in FIG. 22, a space between the side wall of the concave portion 80a and the upper end portion of the rotation sleeve 82 corresponds to the ejection hole for ejecting the separation gas. In addition, the center area is configured with the ejection hole, the rotation sleeve 82, and the pillar 81.

In addition, the heater unit 7 in FIG. 22 is composed of the outer heater 7O, the center heater 7C, and the inner heater 7I, as explained in reference to FIGS. 1 through 3, and the thermocouples 8O, 8C, 8I are provided for the corresponding heaters 7O, 7C, 7I, as explained in reference to FIG. 3. Therefore, the temperature uniformity across the susceptor 2 and the wafer W that is placed on the susceptor 2 can be improved in the film deposition apparatus in FIG. 22, as confirmed in the experiment.

Although two kinds of reaction gases are used in the film deposition apparatus according to the above embodiment, three or more kinds of reaction gases may be used in other film deposition apparatus according to other embodiments (including those described later) of the present invention. In this case, a first reaction gas nozzle, a separation gas nozzle, a second reaction gas nozzle, a separation gas nozzle, and a third reaction gas nozzle may be located in this order at predetermined angular intervals, each nozzle extending along the radial direction of the susceptor 2. Additionally, the separation areas D including the corresponding separation gas nozzles are configured in the same manner as explained above.

Second Embodiment

Next, a film deposition apparatus according to a second embodiment of the present invention is explained with reference to FIGS. 23 through 26. The second embodiment is different from the first embodiment in that radiation thermometers are used for measuring a temperature of the susceptor 2 instead of the thermocouples 8O, 8C, 8I of the first embodiment. The following explanations mainly focus on the differences.

Figure 23:
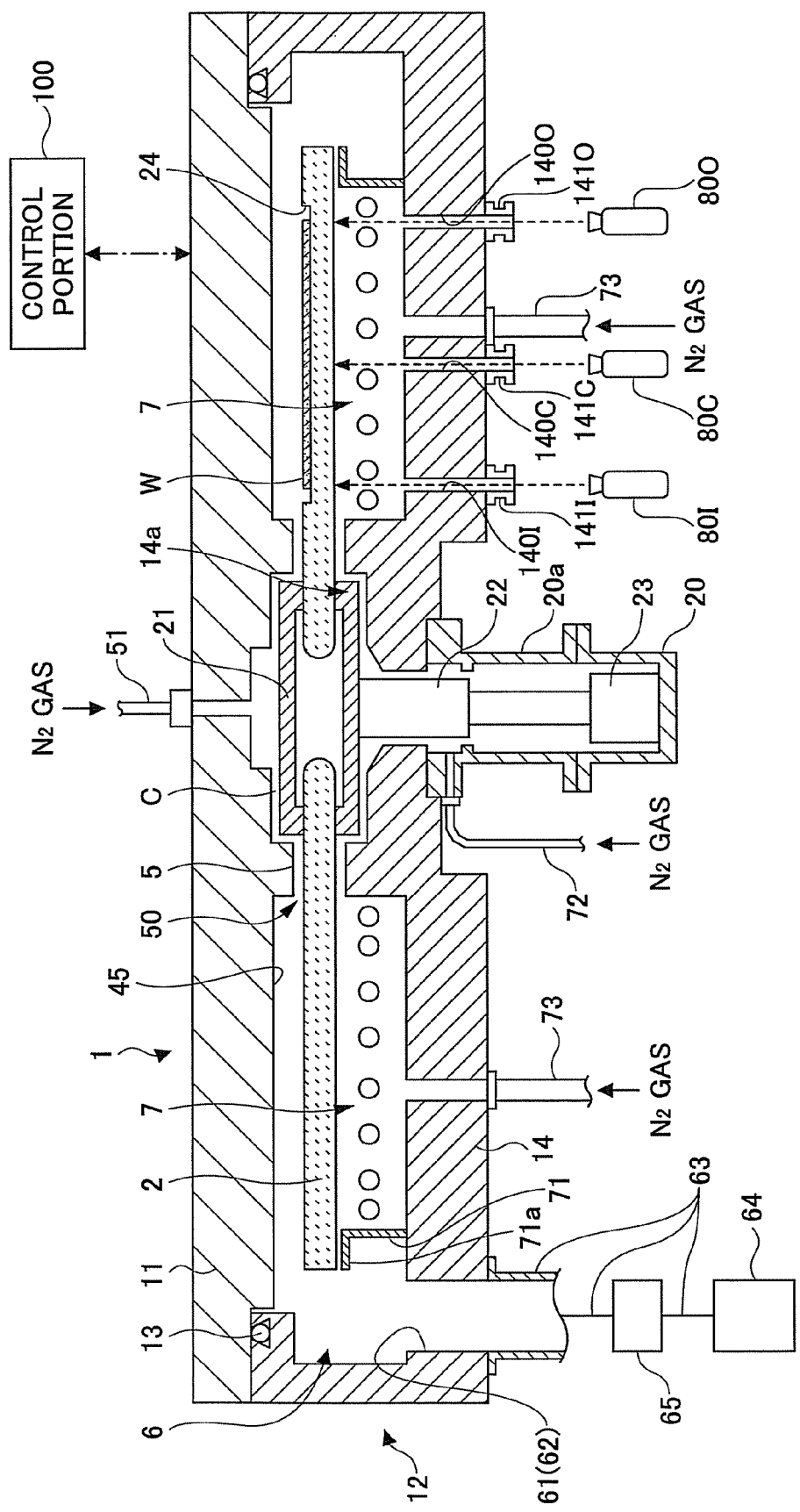
FIG. 23 is a cross-sectional view of a film deposition apparatus according to a second embodiment of the present invention.
Figure 24:
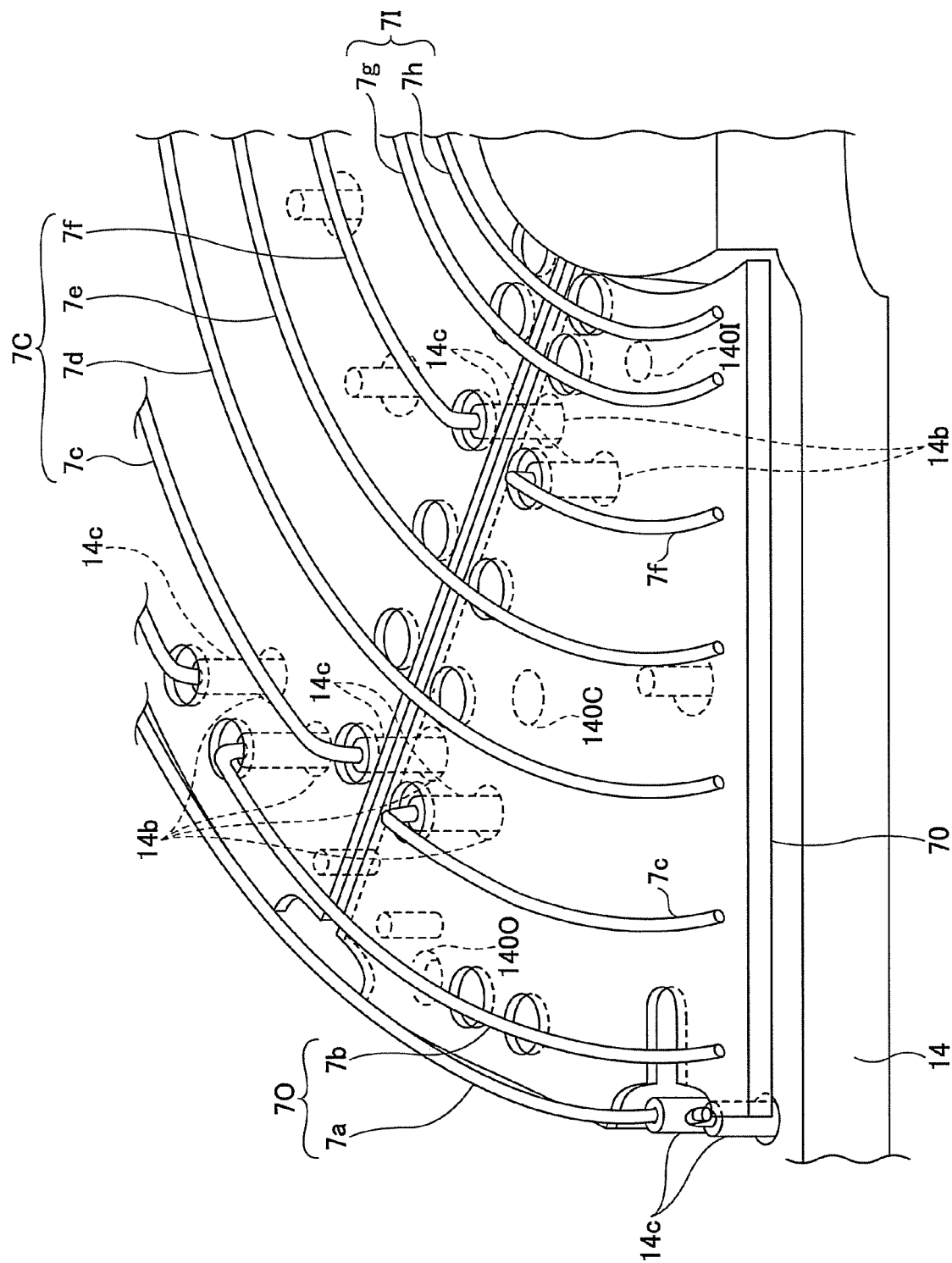
FIG. 24 is an enlarged partial perspective view showing a heater unit of the film deposition apparatus in FIG. 22.

Referring to FIG. 23, through-holes 140O, 140C, 140I are formed in the bottom portion 14 of the chamber body 12. View ports 141O, 141C, 141I are attached on the back surface of the bottom portion 14 in order to hermetically cover the through-holes 140O, 140C, 140I. As shown in FIG. 24, the through-hole 140O is located so that the back surface of the susceptor 2 can be seen between the heater elements 7a and 7b through the view port 141O; the through-hole 140C is located so that the back surface of the susceptor 2 can be seen between the heater elements 7d and 7e through the view port 141C; and the through-hole 140I is located so that the back surface of the susceptor 2 can be seen between the heater elements 7g and 7h through the view port 141I. In addition, as shown in FIG. 23, radiation thermometers 8O, 8C, 8I are arranged below the view ports 141O, 141C, 141I, respectively.

The radiation thermometer 8O measures through the view port 141O and the through-hole 140O a temperature of a position of the susceptor 2 that is heated by the outer heater 7O. The radiation thermometer 8O outputs a signal to the temperature controller (not shown), which in turn generates a temperature control signal based on the signal received from the radiation thermometer 8O and outputs the temperature control signal to the power source (not shown) connected to the outer heater 7O (heater elements 7a, 7b). The power source supplies electrical power to the outer heater 7O in accordance with the temperature control signal received from the temperature controller. With this, the temperature of the portion of the susceptor 2 heated by the outer heater 7O is controlled. In the same manner, temperatures of portions of the susceptor 2 heated by the center heater 7C and the inner heater 7I, respectively, are measured and controlled.

The film deposition apparatus according to the second embodiment can operate in the same manner as the film deposition apparatus according to the first embodiment except that the temperature of the susceptor 2 (wafer W) is measured by the radiation thermometers 8O, 8C, 8I. Thus, explanations of the operations of the film deposition apparatus according to the second embodiment are omitted.

In addition, the same experiment was carried out in the film deposition apparatus according to the second embodiment using the radiation thermometers 8O, 8C, 8I, and substantially the same results have been obtained. Namely, according to the film deposition apparatus of the second embodiment, the across-wafer temperature uniformity of the wafer W placed on the susceptor 2 can be improved because the heater unit 7 for heating the susceptor 2 is divided into the outer heater 7O, the center heater 7C, and the inner heater 7I in the radius direction and temperatures of the portions of the susceptor 2 heated by the corresponding heaters 7O, 7C, 7I are measured and controlled by the corresponding radiation thermometers 8O, SC, 8I.

According to the film deposition apparatus of this embodiment, because the film deposition apparatus includes the separation areas D including the low ceiling surface 44 between the first process area P1, to which the BTBAS gas is supplied from the first reaction gas nozzle 31, and the second process area P2, to which the $O_3$ gas is supplied from the second reaction gas nozzle 32, the BTBAS gas (the $O_3$ gas) is impeded from flowing into the second process area P2 (the first process area P1) and being mixed with the $O_3$ gas (the BTBAS gas). Therefore, an MLD (or ALD) mode deposition of silicon dioxide is assuredly performed by rotating the susceptor 2 on which the wafers W are placed in order to allow the wafers W to pass through the first process area P1, the separation area P, the second process area P2, and the separation area D. In addition, the separation areas D further include the separation gas nozzles 41, 42 from which the $N_2$ gases are ejected in order to further assuredly impede the BTBAS gas (the $O_3$ gas) from flowing into the second process area P2 (the first process area P1) and being mixed with the $O_3$ gas (the BTBAS gas). Moreover, because the vacuum chamber 1 of the film deposition apparatus according to this embodiment has the center area C having the ejection holes from which the $N_2$ gas is ejected, the BTBAS gas (the $O_3$ gas) is impeded from flowing into the second process area P2 (the first process area P1) through the center area C and being mixed with the $O_3$ gas (the BTBAS gas). Furthermore, because the BTBAS gas and the $O_3$ gas are not mixed, almost no deposits of silicon dioxide are made on the susceptor 2, thereby reducing particle problems.

Modification Example 1 of the Second Embodiment

Figure 25:
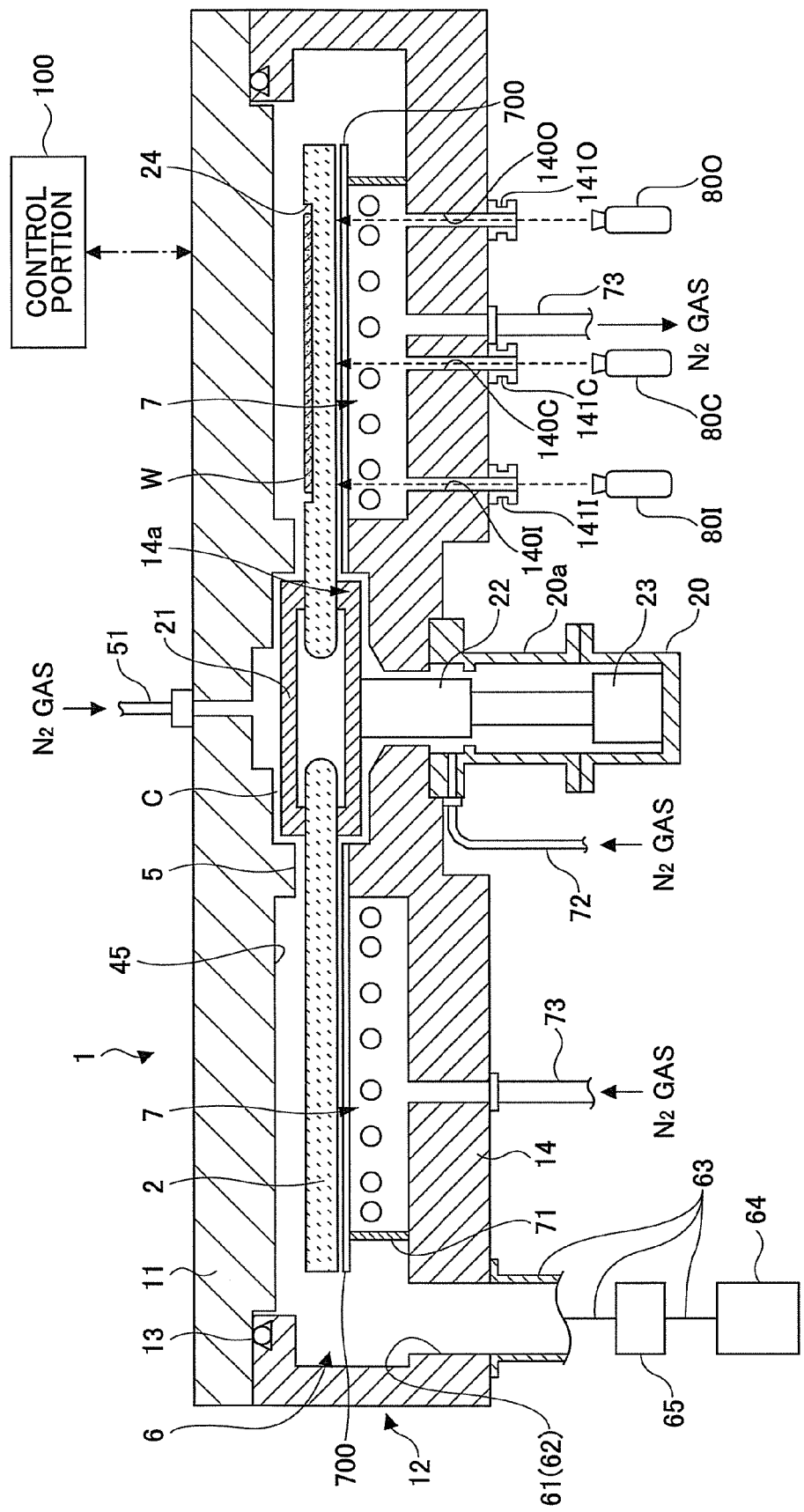
FIG. 25 is a cross-sectional view showing a modification example of the film deposition apparatus in FIG. 22.
Figure 26:
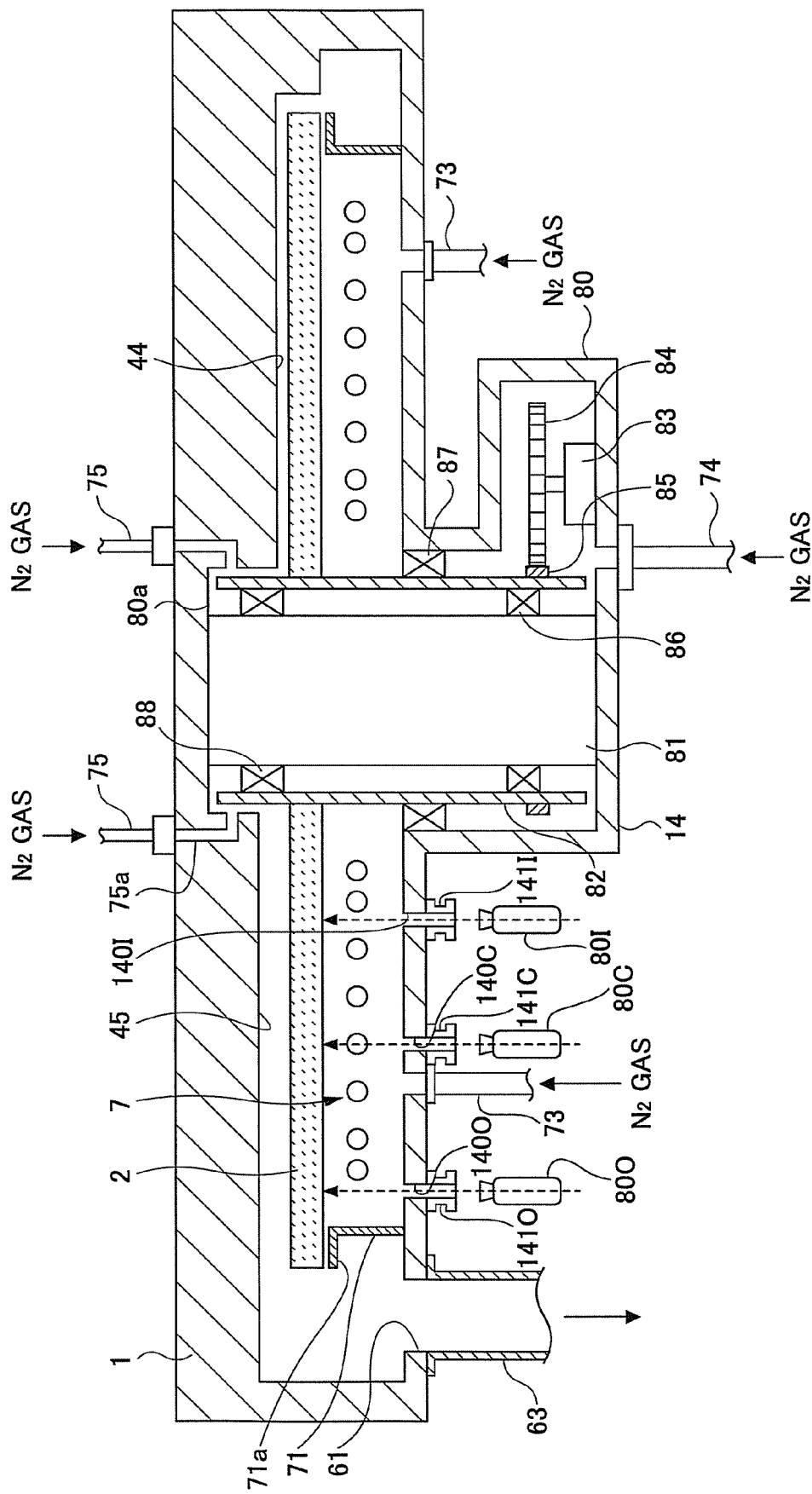
FIG. 26 is a cross-sectional view of a modification example of the second embodiment of the present invention.

As stated above, the vacuum chamber 1 of the film deposition apparatus according to the second embodiment of the present invention, the temperature of the susceptor 2 is measured from the back surface of the susceptor 2 through the through-holes 140O, 140C, 140I made in the bottom portion 14 of the chamber body 12 by the radiation thermometers 8O, 8C, SI, and controlled. In this case, there may be a deviation of the measured temperature from the real temperature when a silicon oxide film is deposited on the back surface of the susceptor 2 and thus emissivity of the back surface of the susceptor 2 is made different. In order to avoid such deposition of a film on the back surface of the susceptor 2, the purge gas ($N_2$ gas) is supplied from the purge gas supplying pipe 72 and the purge gas supplying pipes 73 to the heater housing space where the heater unit 7 is housed, as explained in the first embodiment with reference to FIG. 9. In order to enhance the purging effect, a partition plate 700 may be provided between the heater unit 7 and the susceptor 2 as shown in FIG. 25. In the illustrated example, the partition plate 700 is supported by the raised portion 14a of the bottom portion 14 and the upper end of the cover member 71, leaving a small space between the partition plate 700 and the back surface of the susceptor 2. A height of the small space (distance between the partition plate 700 and the susceptor 2) may be substantially the same as the height h of the ceiling surface 44 from the upper surface of the susceptor 2. The height h is set in order to effectively impede gas from flowing into the space having the height of h, as explained above. In addition, it is clearly seen from FIG. 25 that the purge gas ($N_2$ gas) supplied from the purge gas pipe 72 flows into the small space through the gap between the rotational shaft 22 and the opening at the bottom portion 14, and the gap between the raised portion 14a and the core portion 21, and further flows into the evacuation area 6. With this, the reaction gases (e.g., BTBAS, $O_3$) are substantially prevented from flowing into the small space from the evacuation area 6. Therefore, film deposition on the back surface of the susceptor 2 is substantially prevented.

Modification Example 2 of the Second Embodiment

The film deposition apparatus according to the second embodiment may be modified in order to have the same configuration as the modification example 1 of the film deposition apparatus according to the first embodiment. Namely, the heater unit 7 is composed of the outer heater 7O, the center heater 7C, and the inner heater 7I and the temperature of the susceptor 2 is measured by the radiation thermometers 8O, 8C, 8I through the through-holes 140O, 140C, 140I in the film deposition apparatus shown in FIG. 26 in the same manner as explained in the first embodiment. Therefore, the temperature uniformity of the susceptor 2 and the wafer W that is placed on the susceptor 2 can be improved in the same manner as confirmed in the above experiment even in the film deposition apparatus of FIG. 26.

Third Embodiment

Figure 27:
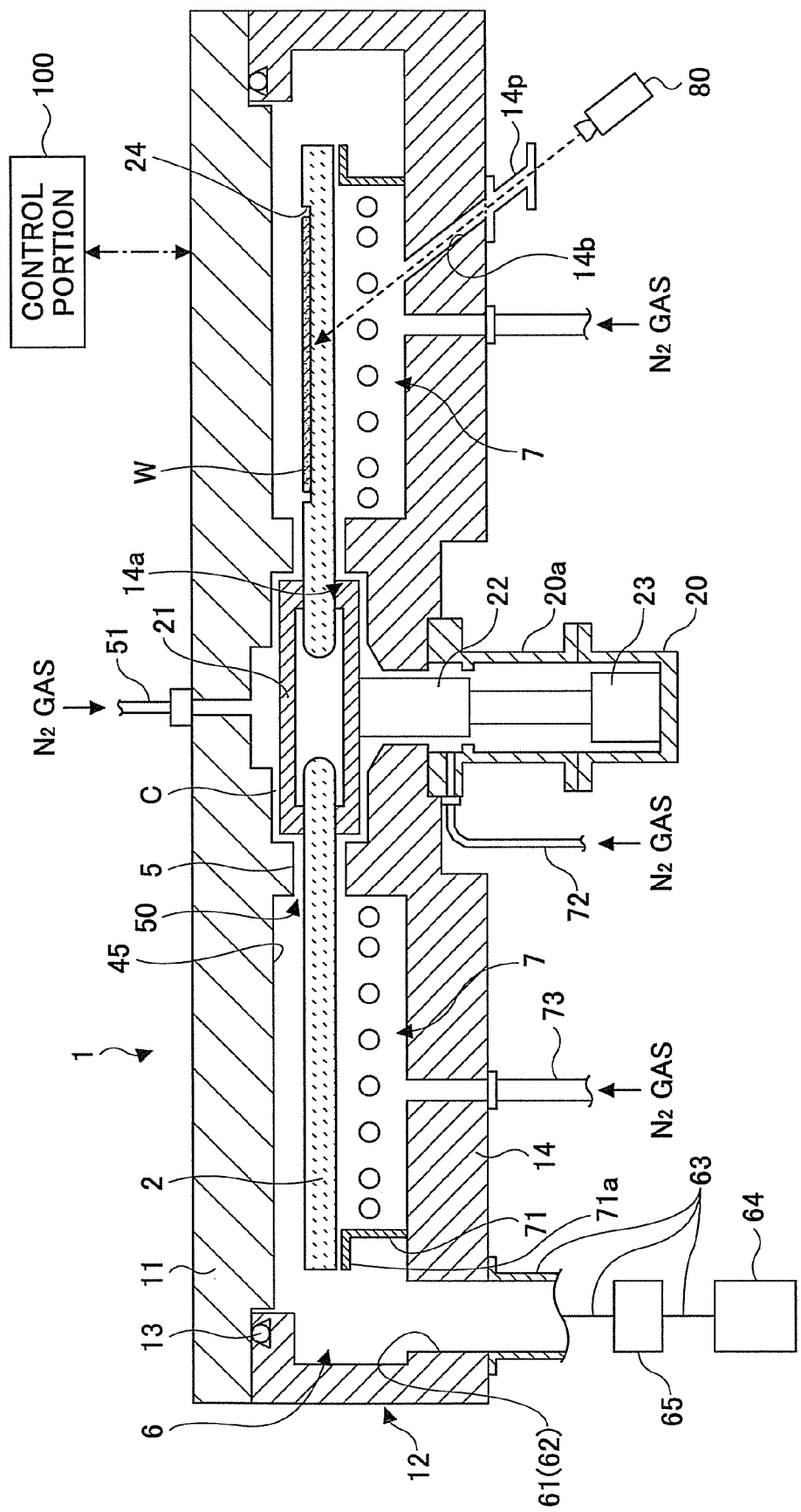
FIG. 27 is a cross-sectional view of a film deposition apparatus according to a third embodiment of the present invention.
Figure 28:
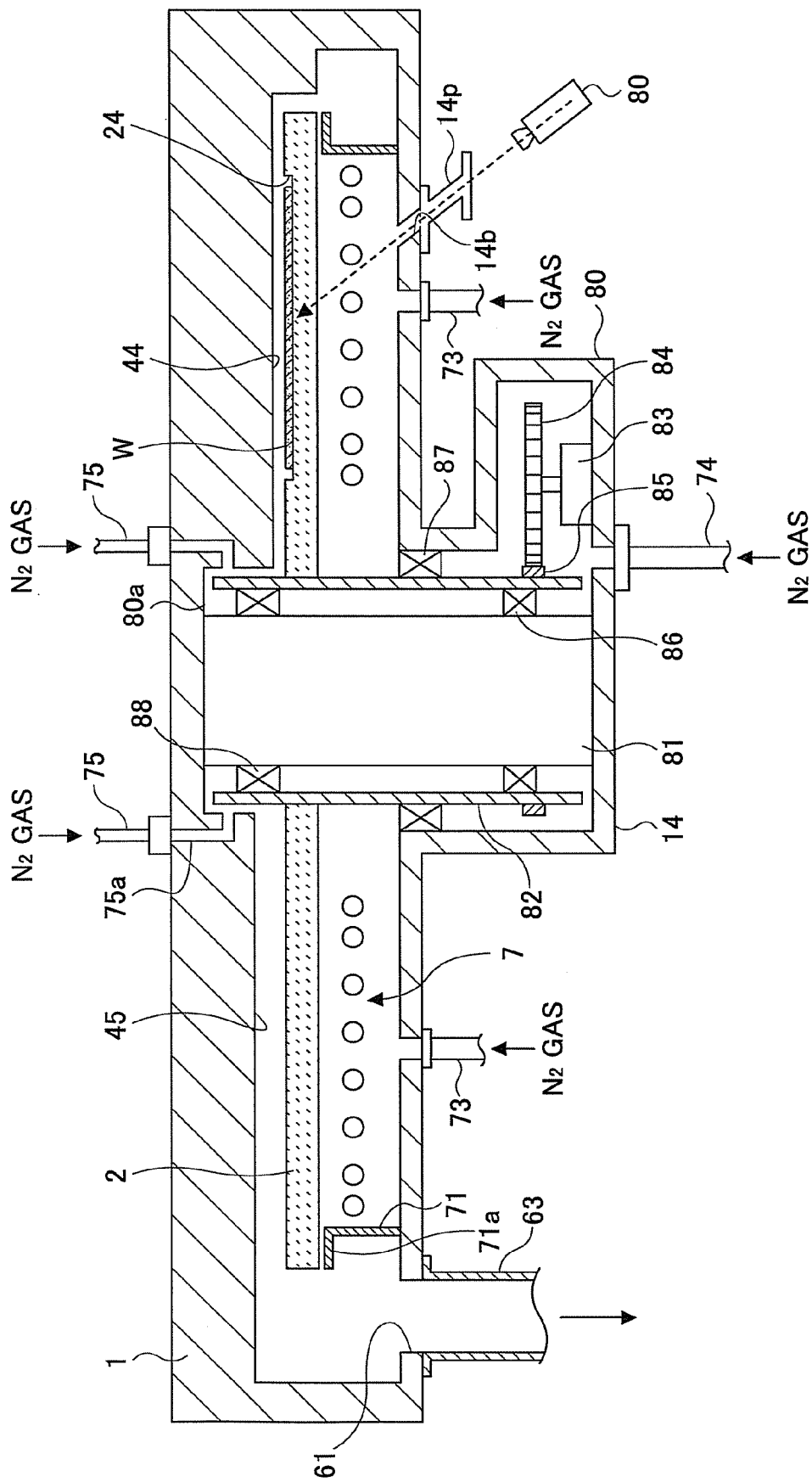
FIG. 28 is a cross-sectional view of a modification example of the third embodiment of the present invention.
Figure 29:
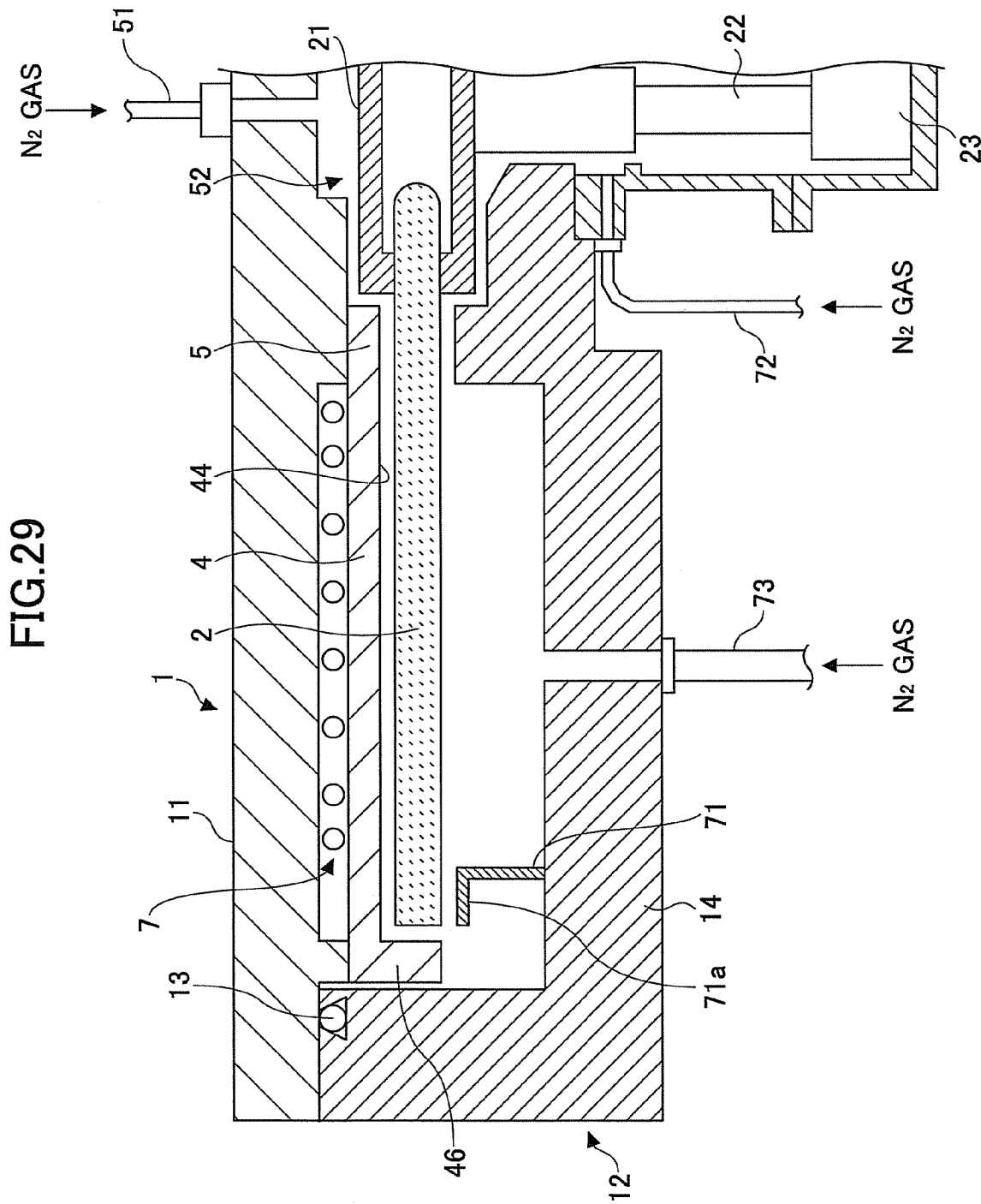
FIG. 29 shows a modification example of a heater unit of the film deposition apparatus according to the third embodiment of the present invention.

Next, a film deposition apparatus according to a third embodiment of the present invention is explained with reference to FIGS. 27 through 29. The explanation focuses mainly on differences of the third embodiment from the first and the second embodiments.

In the third embodiment, the susceptor 2 has a shape of a disk having a thickness of about 20 mm and a diameter of about 980 mm and is made of quartz. The susceptor 2 has a circular opening at the center and is clamped around the opening by the cylinder-shaped core portion 21. The core portion 21 is fixed on the top end of the rotational shaft 22 that extends in a vertical direction and the rotational shaft 22 penetrates a bottom portion 14 of the chamber body 12 and is fixed at the lower end to a driving mechanism 23 that can rotate the rotational shaft 22 clockwise, in the same manner as the previous embodiments.

In the susceptor 2 in this embodiment, a bottom of the concave portion 24 is transparent, and thus the heater unit 7 arranged below the susceptor 7 is visible through the concave portion 24. With this, light and/or heat (infra-red light and the like) radiated from the heater unit 7 can go through the concave portion 24 of the susceptor 2 and reach the wafer W placed in the concave portion 24. Therefore, the wafer W is mainly heated by the radiation from the heater unit 7. On the other hand, portions of the susceptor 2 except for the concave portions 24 are roughened and opaque. These portions are roughened by, for example, sand-blasting, machining such as stone grinding, or etching with a predetermined etchant. With this, the radiation from the heater unit 7 is absorbed, scattered, or reflected in the opaque portion, thereby preventing the convex portion 4 and the ceiling plate 11 from being excessively heated by the radiation. Here, the roughened surface of the susceptor 2 may be made on the same surface where the concave portions 24 are formed and/or the opposite surface. However, because the reaction gases may be easily adsorbed on the roughened surface resulting in a film deposited on the surface, when the surface where the concave portions 24 are provided is roughened, such a deposited film may be peeled off, thereby generating particles. Therefore, the opposite surface is preferably roughened. In addition, the portion except for the concave portion 24 may be transparent depending on a wafer temperature during deposition.

Moreover, the back surface of the concave portion 24 where the wafer W is placed is typically flat, but may be lumpy as long as the transparency to the radiation from the heater unit 7 is not significantly degraded. For example, plural convex lenses (micro lenses) may be formed on the back surface of the concave portion 24. With this, the radiation from the heater unit 7 is appropriately dispersed so that the wafer W placed in the concave portion 24 can be uniformly heated.

Furthermore, the bottom surface of the concave portion 24 may have distributed transparency. For example, a degree of grinding may be changed in the bottom surface of the concave portion 24 so that the concave portion 24 may have high transparency at the center and low transparency at the circumferential portion.

Referring again to FIG. 27, the bottom portion 14 of the chamber body 12 is provided with a through-hole 14b extending at a predetermined angle with respect to an upper surface of the bottom portion 14 (the bottom surface of the vacuum chamber 1) and a view port 14p extending at the same angle below the through-hole 14b. The angle is determined so that the back surface of the wafer W placed in the transparent concave portion 24 is visible through the view port 14p and the through-hole 14b. A temperature of the wafer W is measured through the view port 14p and the through-hole 14b by a radiation thermometer 80. The control portion 100 controls electrical power supplied to the heater unit 7 from a power source (not shown) in accordance with the temperature of the wafer W measured by the radiation thermometer 8O, so that the wafer W is controlled at a temperature determined by a process recipe.

The film deposition apparatus according to the third embodiment can operate in the same manner as the film deposition apparatus according to the first embodiment except that the temperature of the susceptor 2 (wafer W) is measured by the radiation thermometer 80. Thus, explanations of the operations of the film deposition apparatus according to the third embodiment are omitted.

In the film deposition apparatus according to this embodiment, because the reaction gases are impeded from being mixed in the same manner as the film deposition apparatuses according to the first and the second embodiments, a proper ALD (or MLD) mode film deposition can be realized.

In addition, because the film deposition apparatus according to this embodiment includes the quartz susceptor 2 and the bottom of the concave portion 24 in which the wafer W is placed in the susceptor 2 is transparent, the wafer W is substantially directly exposed to the radiation from the heater unit 7 arranged below the susceptor 2 and thus heated through the radiation. When a susceptor made of, for example, carbon, SiC, or the like is used, because the susceptor is entirely heated and thus the wafer W placed on the susceptor is heated by the heat from the susceptor (through heat conduction or thermal radiation), it may take a relatively long time and a relatively large electrical power to heat the susceptor. In addition, it may take a relatively long time to cool the susceptor when needed, although the temperature tends to be stable once the susceptor is heated.

However, because the wafer W is substantially directly heated by the radiation from the heater unit 7 in the film deposition apparatus according to this embodiment, the wafer W can be heated to a predetermined temperature in a shorter period of time, and the heat can be easily radiated away from the wafer W after the heater unit 7 turns off, thereby cooling the wafer W in a shorter period of time. Therefore, time required for heating/cooling the wafer W is saved, and net operating time of the film deposition apparatus can be increased, thereby improving the manufacturing throughput. In addition, electrical power for heating the wafer W can be saved, and thus it is advantageous in production costs.

In addition, because the bottom of the concave portion 24 of the susceptor 2 is transparent, a temperature of the wafer W is substantially directly measured from the back by the radiation thermometer 8O. While the temperature of the wafer W is usually measured through a susceptor by a thermocouple arranged near the back surface of the susceptor when the susceptor is made of, for example, carbon, SiC and the like, the temperature can be directly measured according to the susceptor 2 in this embodiment. Moreover, the temperature of the wafer W can be controlled in accordance with a predetermined temperature controlling method while monitoring the temperature of the wafer W, thereby stably maintaining the wafer W at a predetermined temperature.

A temperature of the wafer W may be measured from above by the radiation thermometer when a through-hole and a view port are provided in the ceiling plate 11. However, because a film (i.e., a silicon oxide film in this case) is deposited on the wafer W and thus emissivity varies with a thickness of the deposited film, the emissivity needs to be compensated for.

In addition, plural radiation thermometers may be used to substantially directly measure a temperature of the wafer W placed in the concave portion 24 of the susceptor 2. Specifically, three radiation thermometers are used in the same manner as the second embodiment, and the outer heater 7O, the center heater 7C, and the inner heater 7I of the heater unit 7 may be controlled in accordance with the temperatures measured by the corresponding radiation thermometers, thereby improving temperature uniformity across the wafer.

Modification Example of the Third Embodiment

The film deposition apparatus according to the third embodiment may be modified in order to have the same configuration as the modification example 1 of the film deposition apparatus according to the first embodiment. Namely, even the film deposition apparatus shown in FIG. 22 according to the modification example includes the susceptor 2 made of quartz, and the wafer W placed in the concave portion 24 can be heated through the bottom of the concave portion 24 as the wafer receiving area by the heater unit 7. In addition, when the upper surface (back surface) of the susceptor 2 except for the concave portion 24 is roughened by, for example, sand-blasting, the ceiling portion of the vacuum chamber 1 and the convex portion 4 are not directly heated. In addition, the heater unit 7 may be composed of, for example, the ring-shaped heater elements even in the film deposition apparatus in FIG. 28, and the wafer W may be heated through the radiation from the heater elements. Moreover, a temperature of the wafer W can be measured by the radiation thermometer 80 through the view port 14p, the through-hole 14b, and the bottom of the concave portion 24 of the susceptor 2, and the temperature is controlled in accordance with the measurement results. Plural radiation thermometers may be used. Therefore, the same effect as the first and the second embodiments can be demonstrated in the film deposition apparatus shown in FIG. 28.

In addition, the heater unit 7 for heating the wafer W in the film deposition apparatus according to this embodiment may include a heat lamp instead of the resistance heating wire. Moreover, the heater unit 7 may be arranged above the susceptor 2 rather than below the susceptor 2, or an additional heater unit may be arranged above the susceptor 2 in addition to the heater unit 7 below the susceptor 2. When the heater unit is arranged above the susceptor 2, a gap is made between the convex portion 4 and the ceiling plate 11, and the heater unit having a ring shape as a whole may be placed below the ceiling plate 11 in the gap. Even in this case, the wafer W placed in the concave portion 24 (wafer receiving area) of the susceptor 2 can be uniformly heated when the susceptor 2 is rotated. Additionally in this case, the convex portion 4 may be made of, for example, quartz in order to heat the wafer W through the quartz-made convex portion 4. Moreover, when the heater unit is arranged above the susceptor 2, a circular panel made of, for example, quartz may be arranged below the heater unit in order to prevent the heater unit from being exposed to the reaction gases. When such a panel is arranged, a gas tube that penetrates the ceiling plate 11 is preferably provided in order to supply purge gas to an area between the panel and the ceiling plate 11.

Figure 30:
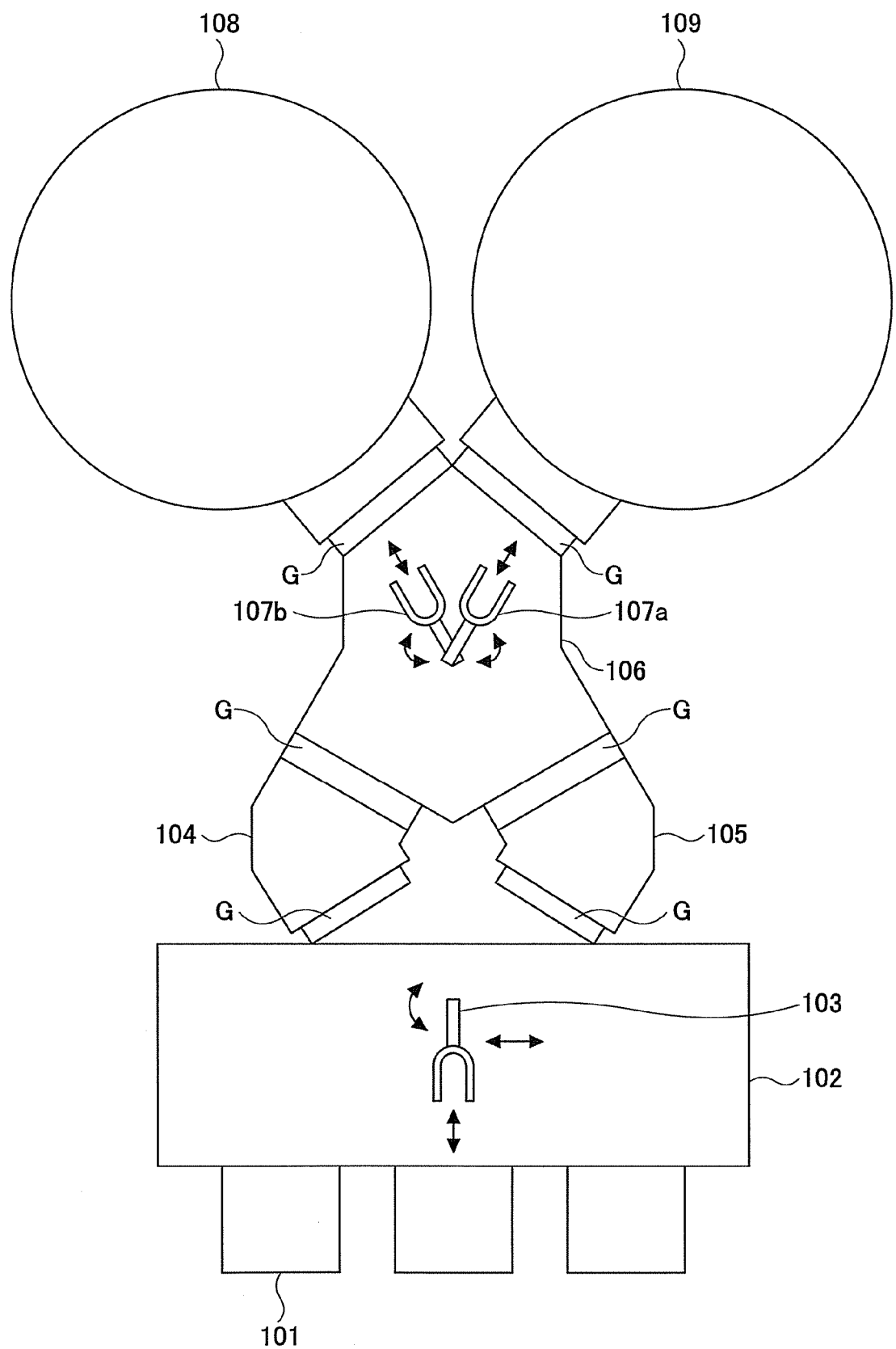
FIG. 30 is a schematic view of a substrate process apparatus with a film deposition apparatus according to an embodiment of the present invention.

The film deposition apparatus according to embodiments of the present invention may be integrated into a wafer process apparatus, an example of which is schematically illustrated in FIG. 30. In FIG. 30, reference numeral "101" indicates a closed-type wafer transfer cassette such as a Front Opening Unified Pod (FOUP) that houses, for example, 25 wafers; reference numeral "102" indicates an atmospheric transfer chamber where a transfer arm 103 is arranged; reference numerals "104" and "105" indicate load lock chambers (preparation chambers) whose inner pressure is changeable between vacuum and an atmospheric pressure; reference numeral "106" indicates a vacuum transfer chamber where two transfer arms 107a, 107b are provided; reference numerals "108" and "109" indicate film deposition apparatuses according to an embodiment of the present invention. The wafer transfer cassette 101 is brought into a transfer port including a stage (not shown); a cover of the wafer transfer cassette 101 is opened by an opening/closing mechanism (not shown); and the wafer is taken out from the wafer transfer cassette 101 by the transfer arm 103. Next, the wafer is transferred to the load lock vacuum chamber 104 (105). After the load lock vacuum chamber 104 (105) is evacuated to a predetermined reduced pressure, the wafer is transferred further to one of the film deposition apparatuses 108, 109 through the vacuum transfer vacuum chamber 106 by the transfer arm 107a (107b). In the film deposition apparatus 108 (109), a film is deposited on the wafer in such a manner as described above. Because the wafer process apparatus has two film deposition apparatuses 108, 109 that can house five wafers at a time, the ALD (or MLD) mode deposition can be performed at high throughput.

While the present invention has been described in reference to the foregoing embodiment, the present invention is not limited to the disclosed embodiment, but may be modified or altered within the scope of the accompanying claims.

What is claimed is:

1. A film deposition apparatus for depositing a film on a substrate by carrying out a cycle of alternately supplying at least two kinds of reaction gases that react with each other to the substrate to produce a layer of a reaction product in a chamber, the film deposition apparatus comprising:
a susceptor rotatably provided in the chamber;
a substrate receiving portion in which the substrate is placed that is provided in one surface of the susceptor;
a heating unit provided under the susceptor and including plural independently controllable heating portions, thereby heating the susceptor;
a first reaction gas supplying portion configured to supply a first reaction gas to the one surface;
a second reaction gas supplying portion configured to supply a second reaction gas to the one surface, the second reaction gas supplying portion being separated from the first reaction gas supplying portion along a rotation direction of the susceptor;
a separation area located along the rotation direction between a first process area in which the first reaction gas is supplied and a second process area in which the second reaction gas is supplied;
a center area that is located substantially in a center portion of the chamber in order to separate the first process area and the second process area, and that has an ejection hole that ejects a first separation gas along the one surface; and
an evacuation opening provided in the chamber in order to evacuate the chamber;
wherein the separation area includes a separation gas supplying portion that supplies a second separation gas, and a ceiling surface that creates in relation to the one surface of the susceptor a thin space in which the second separation gas may flow from the separation area to the process area side in relation to the rotation direction,
wherein the film deposition apparatus further comprises plural temperature sensors corresponding to the plural heating portions, wherein temperatures of parts in the susceptor that are heated by the corresponding heater portions are independently measured by the corresponding temperature sensors,
wherein the temperature sensors comprise a radiation thermometer provided under the susceptor and configured to measure a temperature of a surface of the susceptor heated by the heating unit provided under the susceptor,
wherein the film deposition apparatus further comprises a plate member provided so as to face another surface of the susceptor opposite to the one surface with a space between the another surface and the plate member in the chamber,
wherein the plate member is disposed between the heating unit and a bottom portion of the chamber, and
wherein the plate member has through-holes to permit electrical feedthroughs to pass through and power the heating unit.

2. The film deposition apparatus of claim 1, further comprising a purge gas supplying pipe configured to flow a purge gas to the space between the surface opposing the one surface in the susceptor and the plate member.

3. The film deposition apparatus of claim 1, wherein the plate member includes a conduit for fluid to flow inside the plate member.

4. A film deposition apparatus for depositing a film on a substrate by carrying out a cycle of alternately supplying at least two kinds of reaction gases that react with each other to the substrate to produce a layer of a reaction product in a chamber, the film deposition apparatus comprising:
a heating portion configured to radiatively heat the substrate;

a susceptor rotatably provided in the chamber;

a substrate receiving portion provided in one surface of the susceptor and having a concave portion in which the substrate is placed;

a first reaction gas supplying portion configured to supply a first reaction gas to the one surface;

a second reaction gas supplying portion configured to supply a second reaction gas to the one surface, the second reaction gas supplying portion being separated from the first reaction gas supplying portion along a rotation direction of the susceptor;

a separation area located along the rotation direction between a first process area in which the first reaction gas is supplied and a second process area in which the second reaction gas is supplied;

a center area that is located substantially in a center portion of the chamber in order to separate the first process area and the second process area, and that has an ejection hole that ejects a first separation gas along the one surface; and an evacuation opening provided in the chamber in order to evacuate the chamber;

wherein the separation area includes a separation gas supplying portion that supplies a second separation gas, and a ceiling surface that creates in relation to the one surface of the susceptor a thin space in which the second separation gas may flow from the separation area to the process area side in relation to the rotation direction, wherein the one surface has a first area that does not include the concave portion, and another surface of the susceptor opposite to the one surface of the susceptor has a second area that does not overlap with the concave portion, wherein at least one of the first and second areas has a roughened surface, and the concave portion does not have the roughened surface, wherein the film deposition apparatus further comprises a plate member provided so as to face another surface of the susceptor opposite to the one surface with a space between the another surface and the plate member in the chamber, wherein the plate member is disposed between the heating portion and a bottom portion of the chamber, and wherein the plate member has through-holes to permit electrical feedthroughs to pass through and power the heating portion.

5. The film deposition apparatus of claim 4, wherein the substrate receiving portion allows radiation from the heating portion to go therethrough.

6. The film deposition apparatus of claim 4, further comprising a radiation thermometer configured to measure a temperature of the substrate placed in the substrate receiving portion.

* * * * *